United States Patent
Kutsukake et al.

(10) Patent No.: US 7,374,995 B2
(45) Date of Patent: May 20, 2008

(54) NONVOLATILE SEMICONDUCTOR MEMORY DEVICE

(75) Inventors: Hiroyuki Kutsukake, Yokohama (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 11/430,170

(22) Filed: May 9, 2006

(65) Prior Publication Data
US 2006/0202257 A1    Sep. 14, 2006

Related U.S. Application Data

(63) Continuation of application No. 10/873,296, filed on Jun. 23, 2004, now Pat. No. 7,064,379.

(30) Foreign Application Priority Data

Jun. 23, 2003  (JP) ............... 2003-178418
May 28, 2004  (JP) ............... 2004-158884

(51) Int. Cl.
*H01L 21/336* (2006.01)
*H01L 21/4763* (2006.01)

(52) U.S. Cl. ............... 438/257; 438/593; 257/E21.179; 257/E21.422; 257/E21.68

(58) Field of Classification Search ............... 438/257, 438/593; 257/E21.179, E21.422, E21.68
See application file for complete search history.

(56) References Cited

U.S. PATENT DOCUMENTS 6,894,341 B2   5/2005  Sugimae et al.

2006/0060911 A1   3/2006  Sakuma et al.
2007/0128802 A1*  6/2007  Aritome ............... 438/257

FOREIGN PATENT DOCUMENTS

| JP | 4-253375 | 9/1992 |
| JP | 11-145429 | 5/1999 |
| JP | 2002-50703 | 2/2002 |
| JP | 2002-217318 | 8/2002 |
| JP | 2002-280463 | 9/2002 |

OTHER PUBLICATIONS

Y. Sasago, et al., IEEE IEDM, pp. 952-954, "10-MB/s Multi-Level Programming of GB-Scale Flash Memory Enabled by New AG-and Cell Technology," 2002.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A nonvolatile semiconductor memory device including a memory cell and a selection transistor, and the memory cell includes a floating gate formed on a semiconductor substrate via a first gate insulation film, a pair of first diffusion layers positioned on the opposite sides of the floating gate and formed in the substrate, first and second control gates formed on the opposite sides of the floating gate to drive the floating gate, and an inter-gate insulation film formed between the first and second control gates and the floating gate. The selection transistor includes a selection gate formed on the substrate via a second gate insulation film, and a pair of second diffusion layers formed in the substrate positioned on the opposite sides of the selection gate and one of which is electrically connected to one of the pair of first diffusion layers.

14 Claims, 49 Drawing Sheets

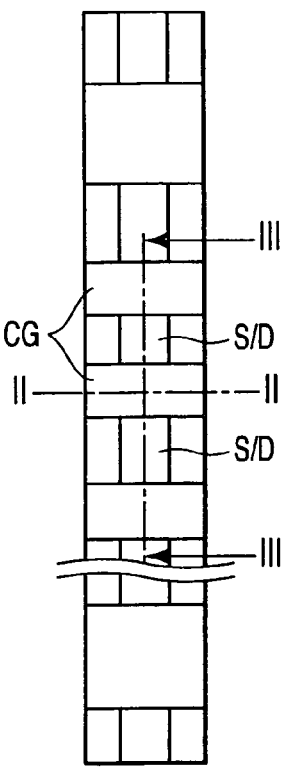
FIG. 1
(PRIOR ART)
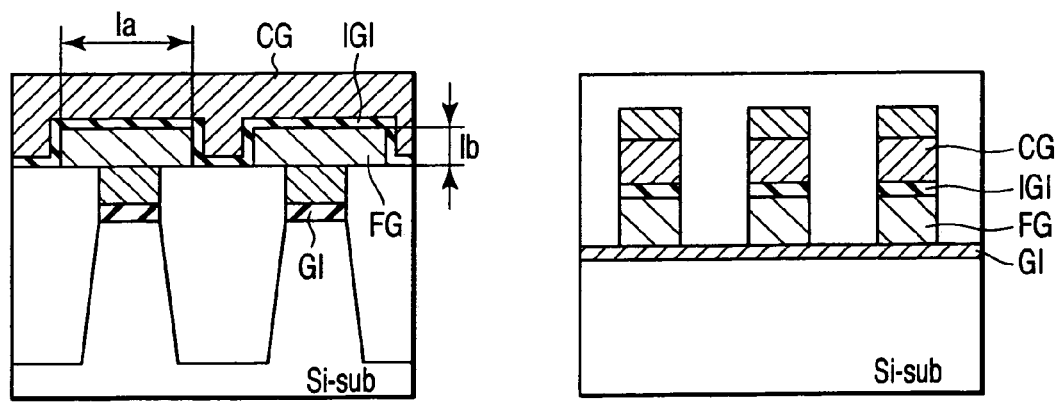
FIG. 2
(PRIOR ART)
FIG. 3
(PRIOR ART)
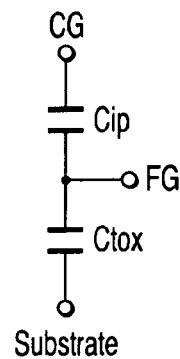
FIG. 4
(PRIOR ART)

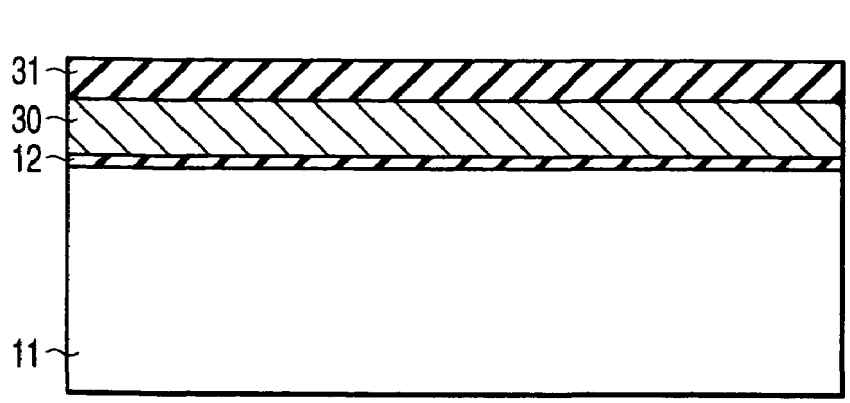 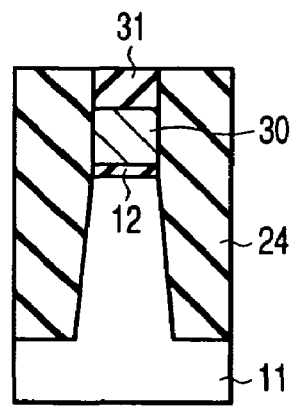
FIG. 12 A    FIG. 12 B
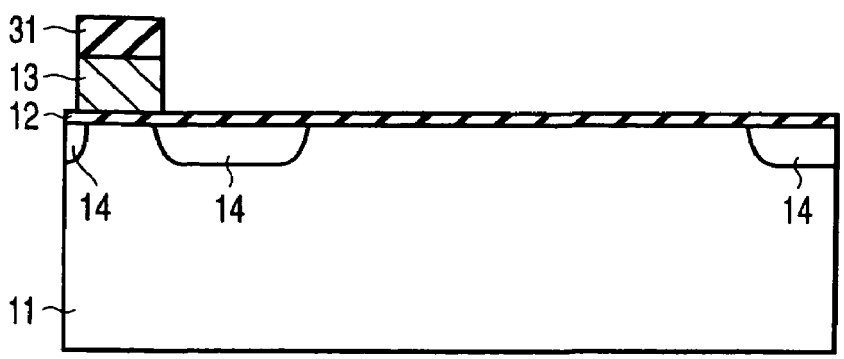 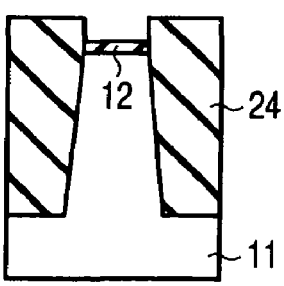
FIG. 13 A    FIG. 13 B

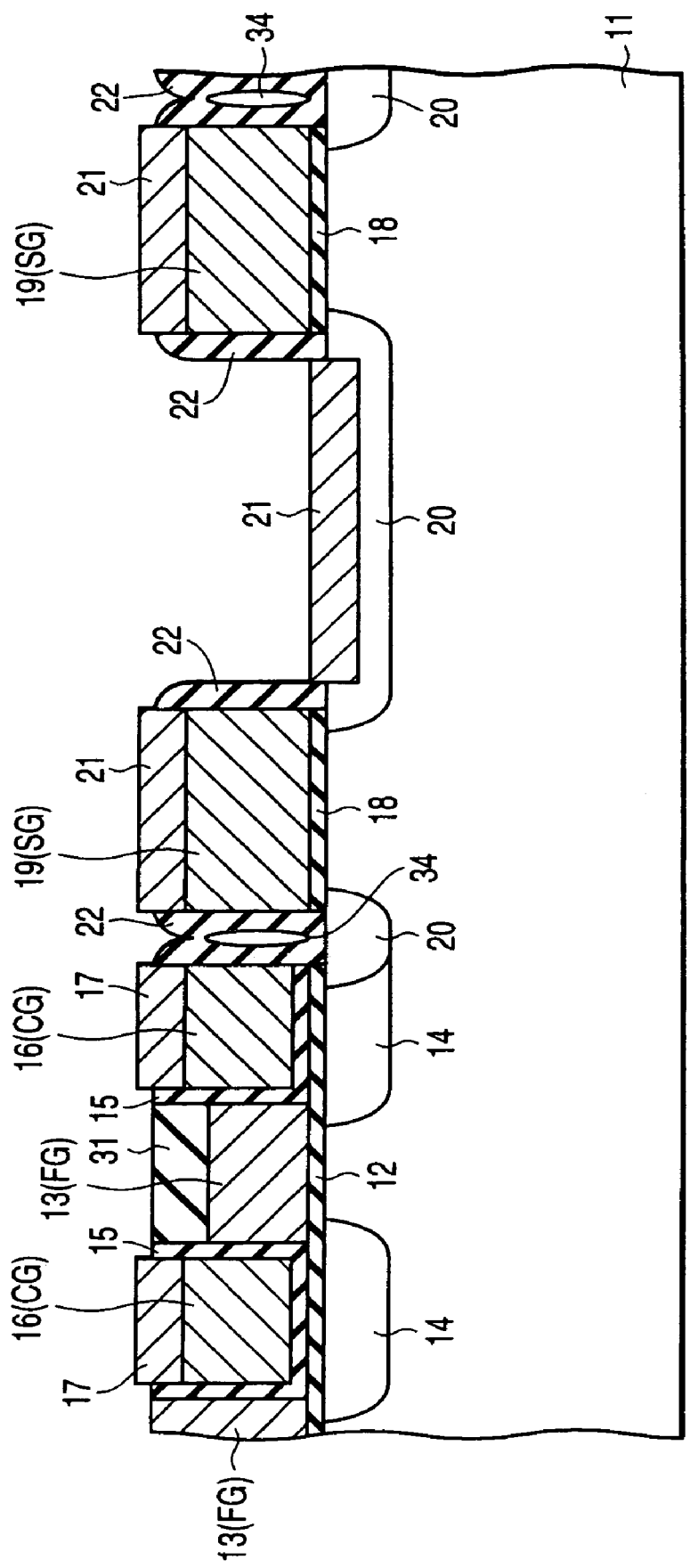
F I G. 20

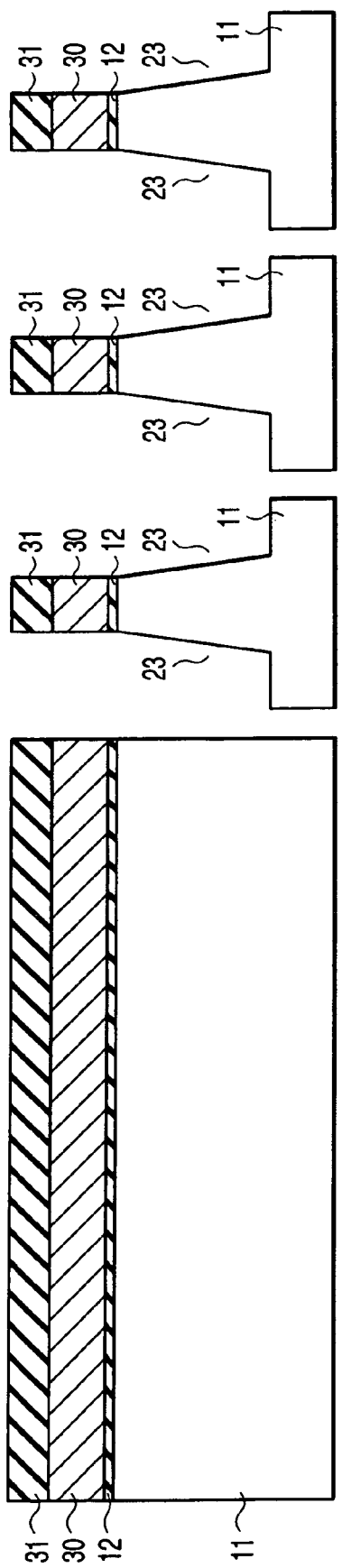

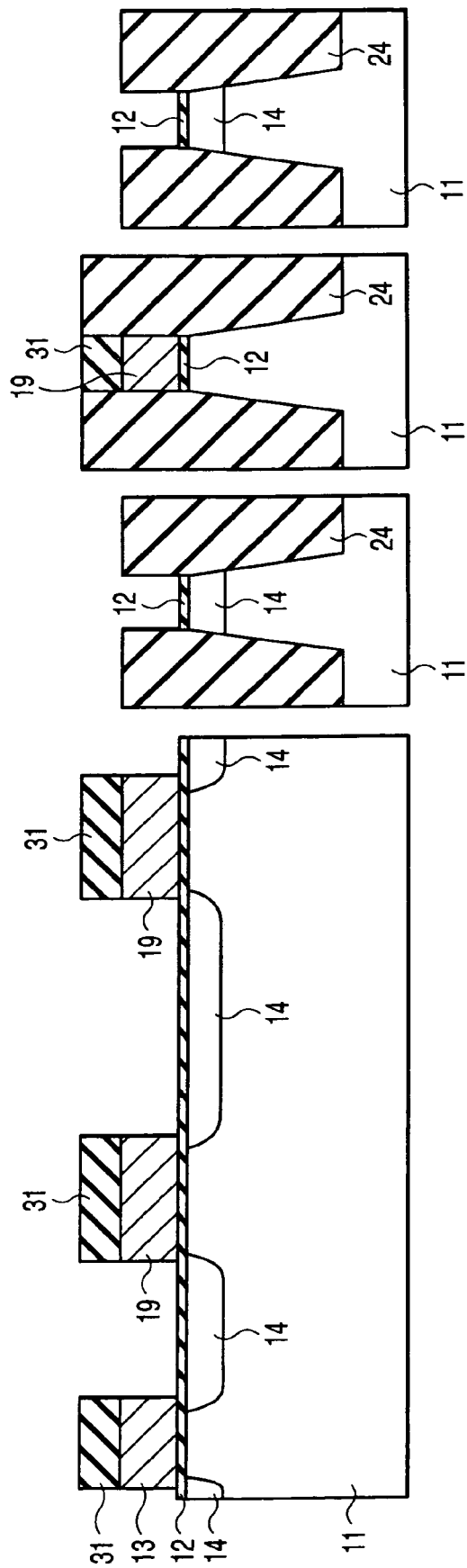

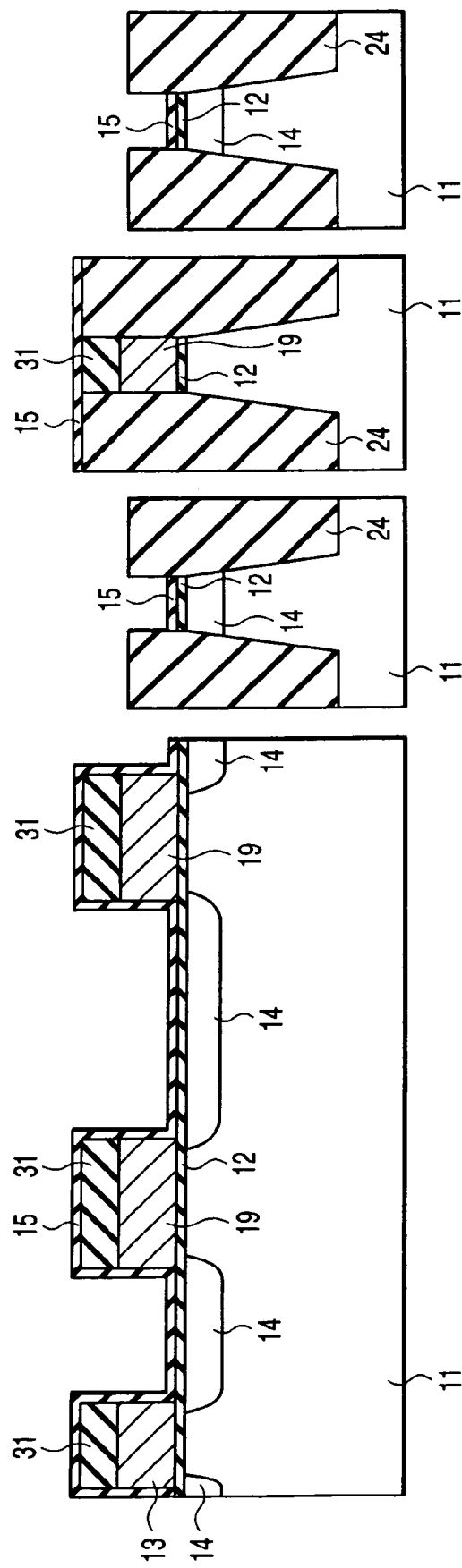

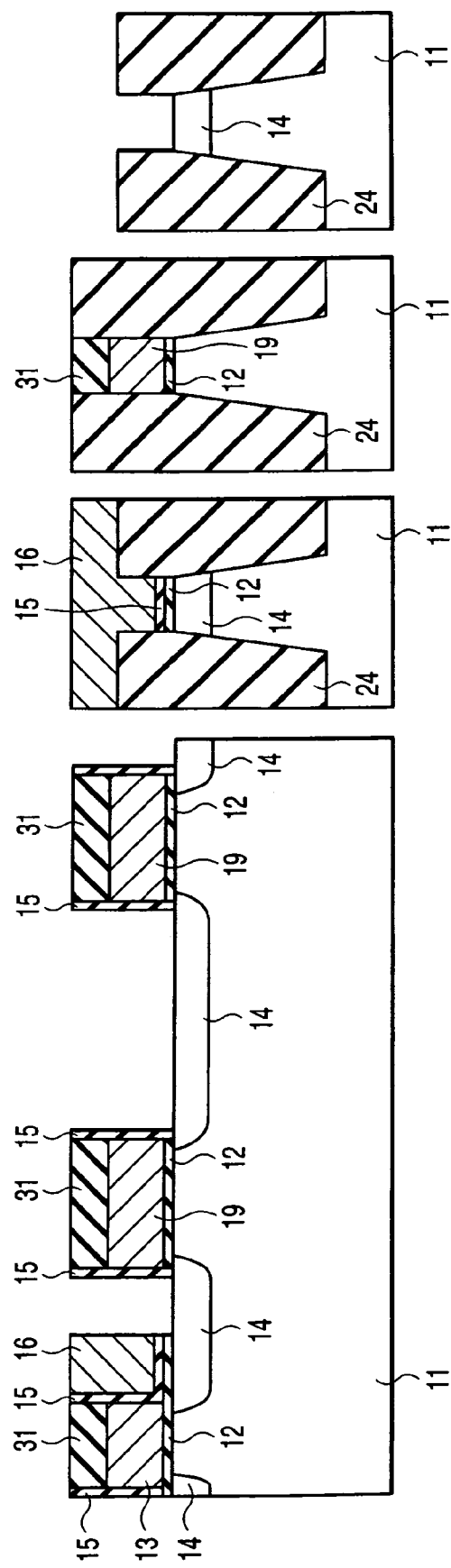

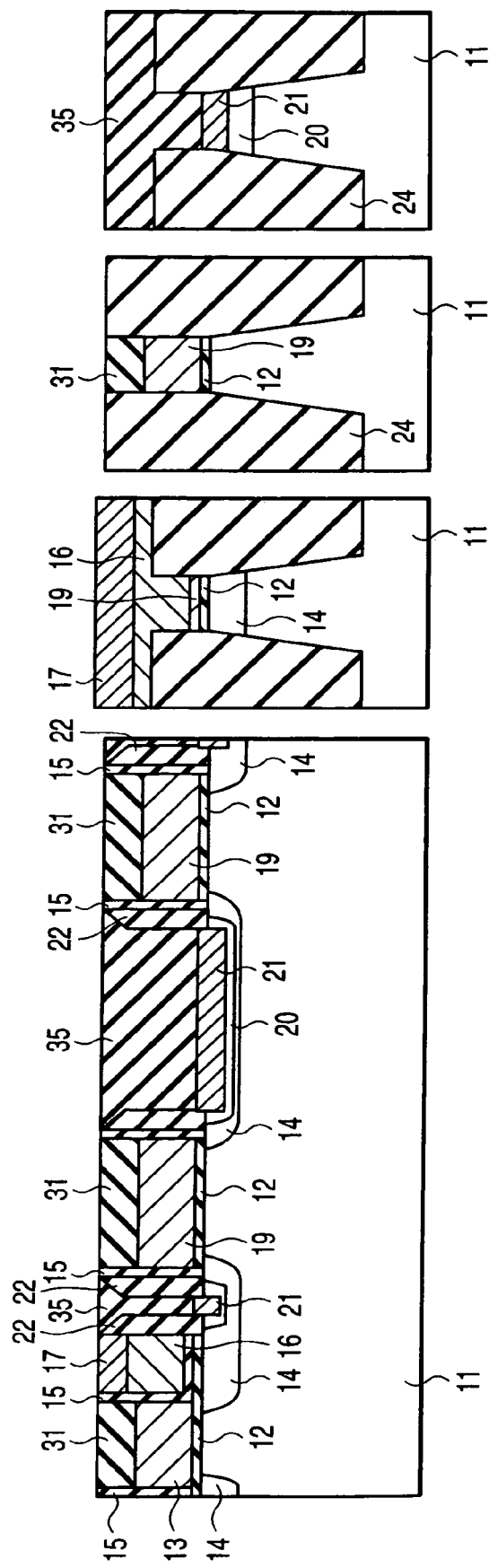

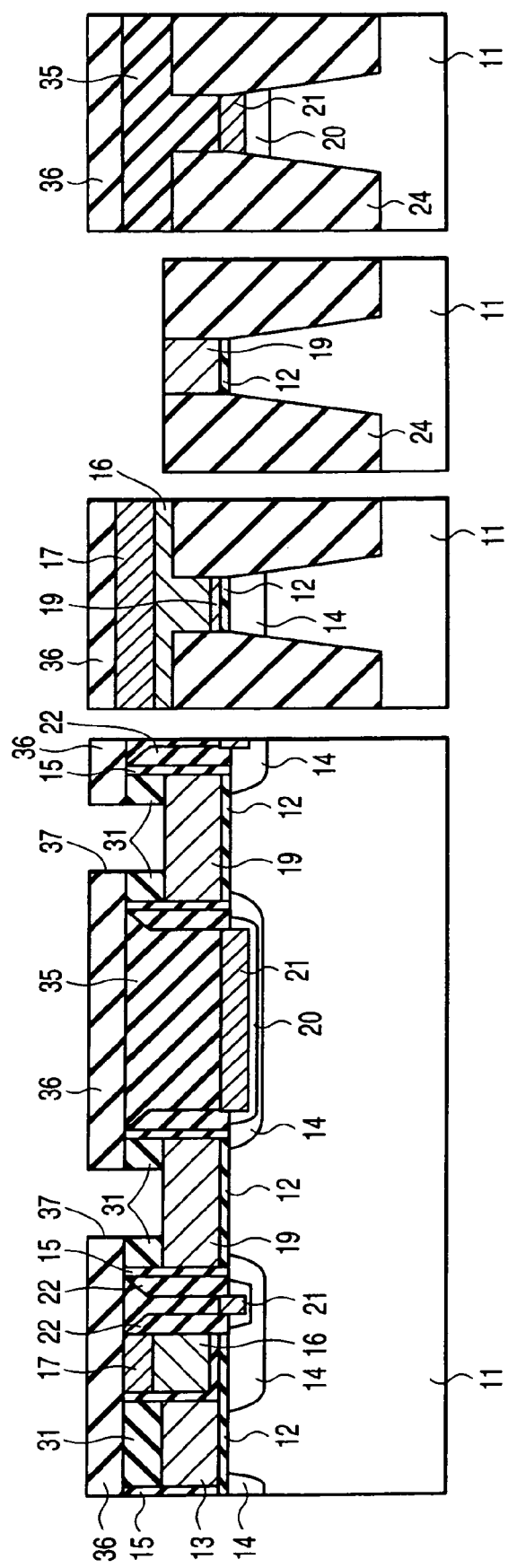

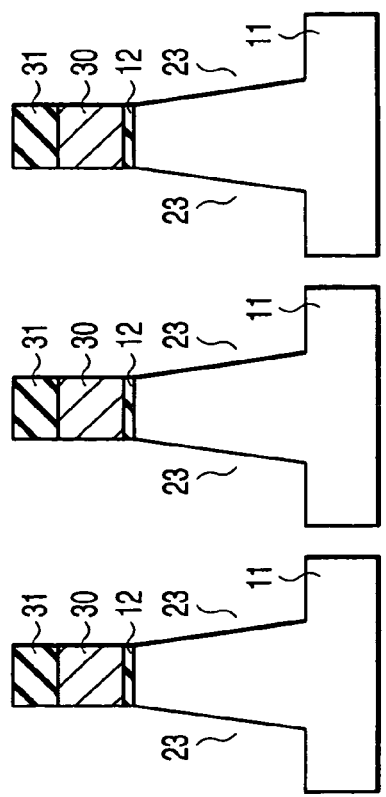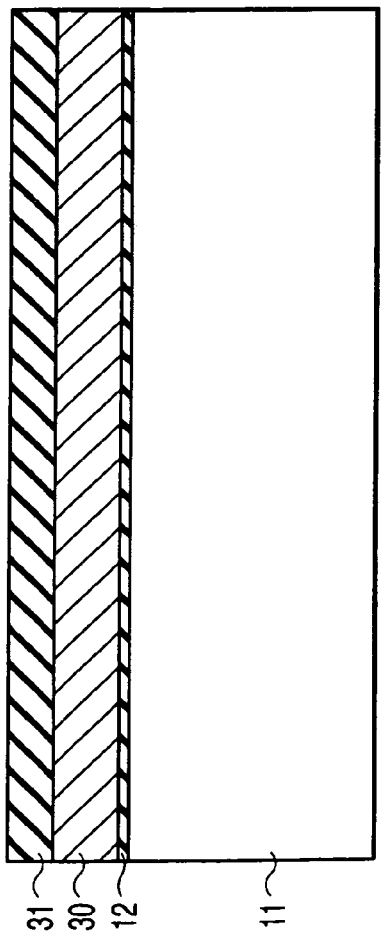

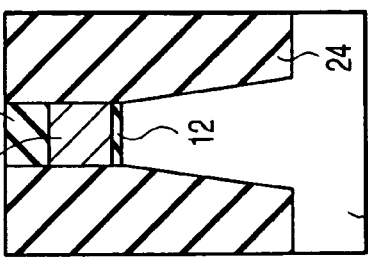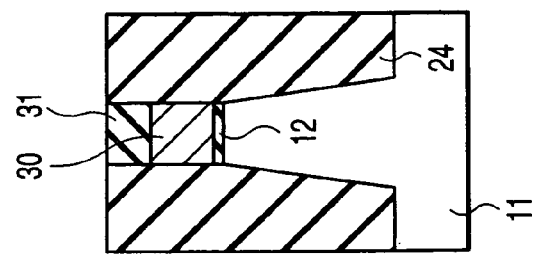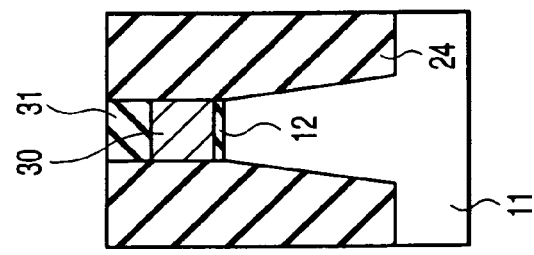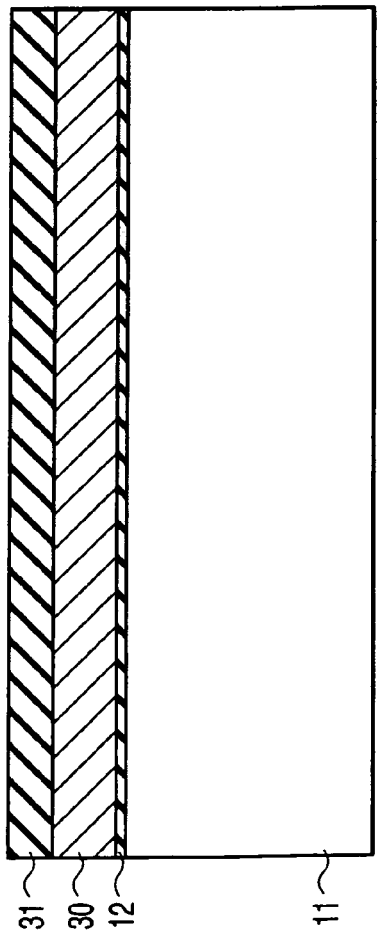

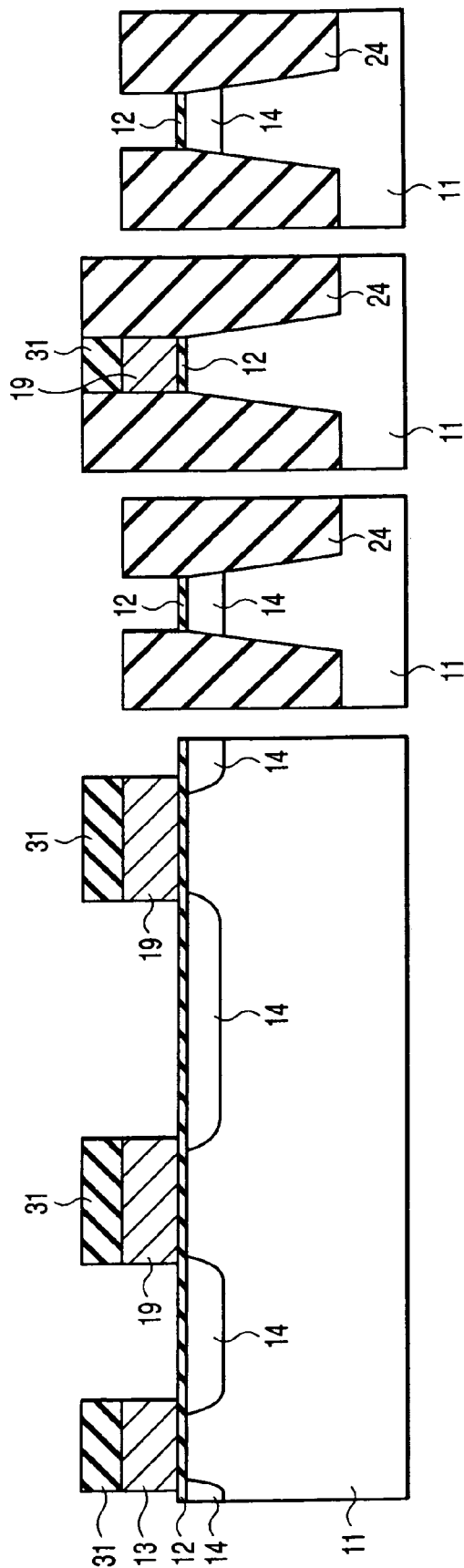

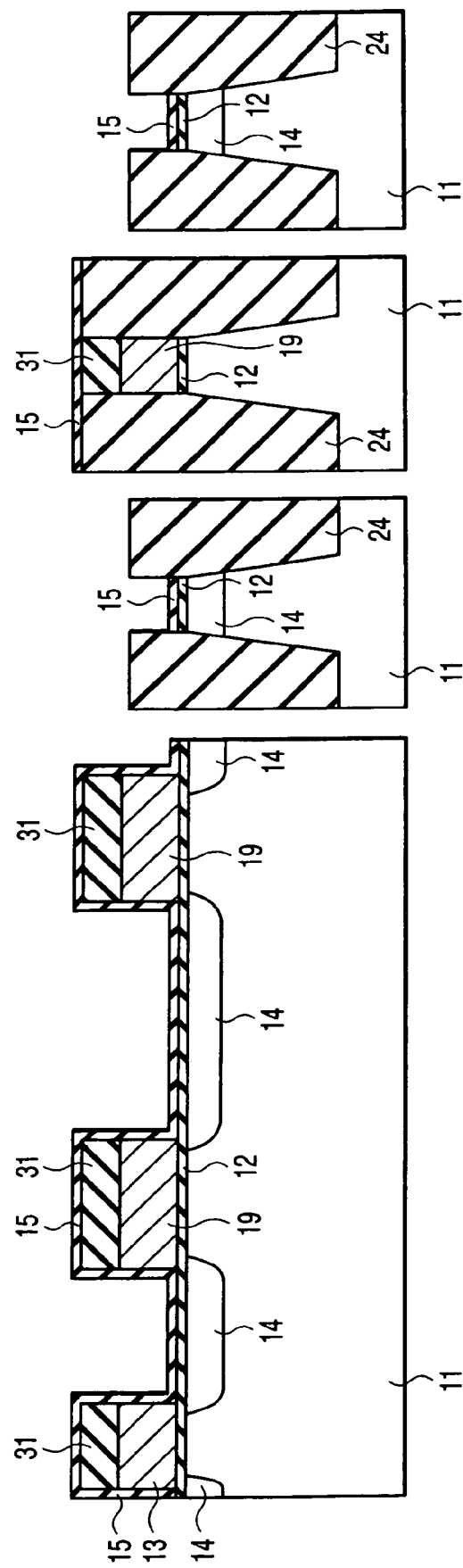

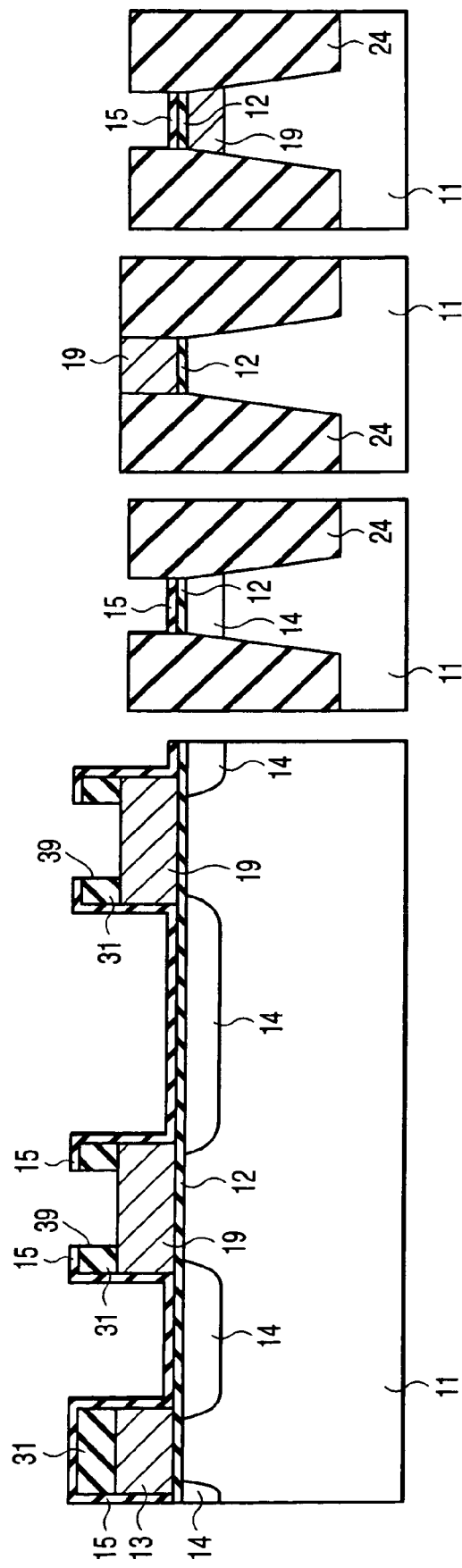

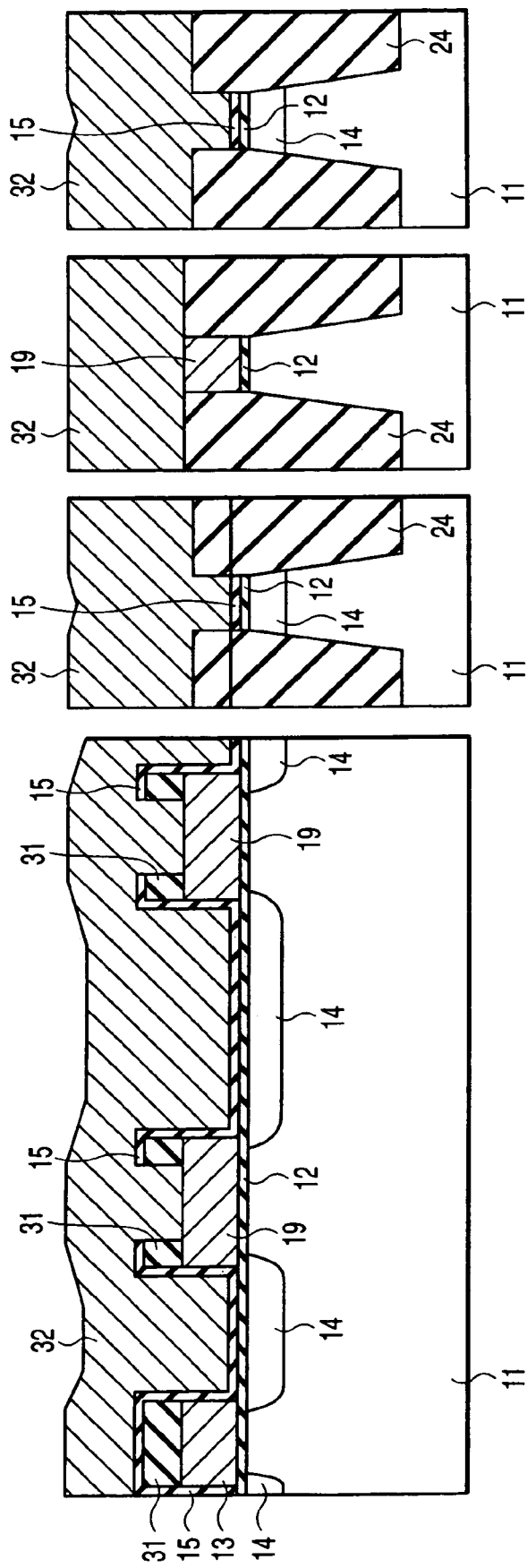

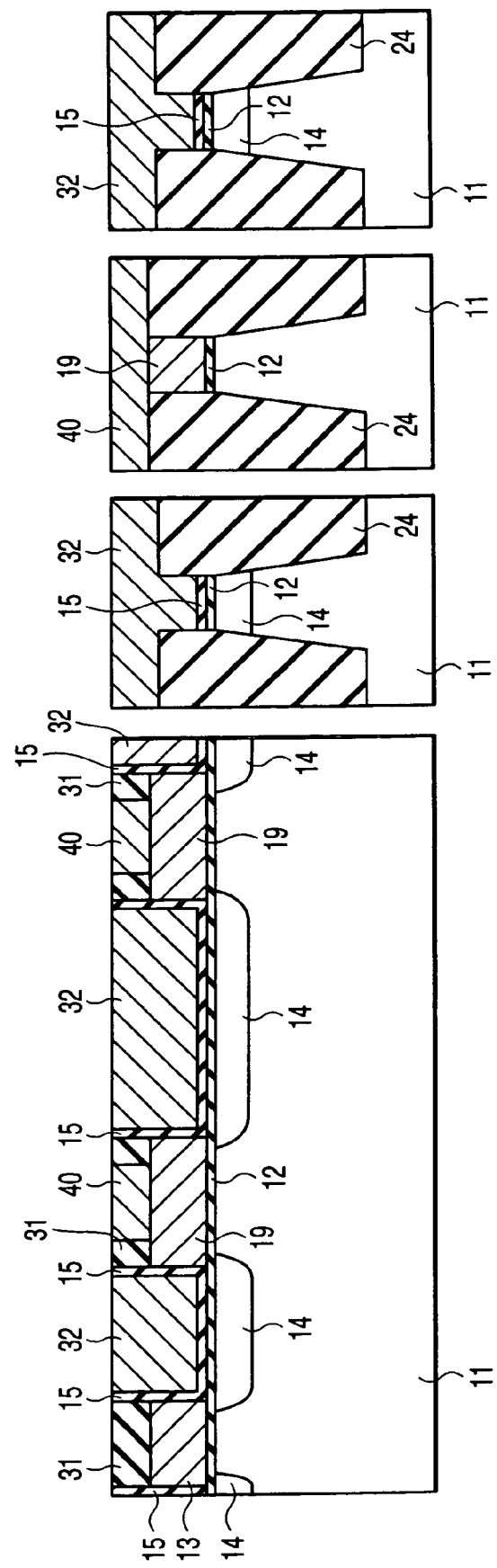

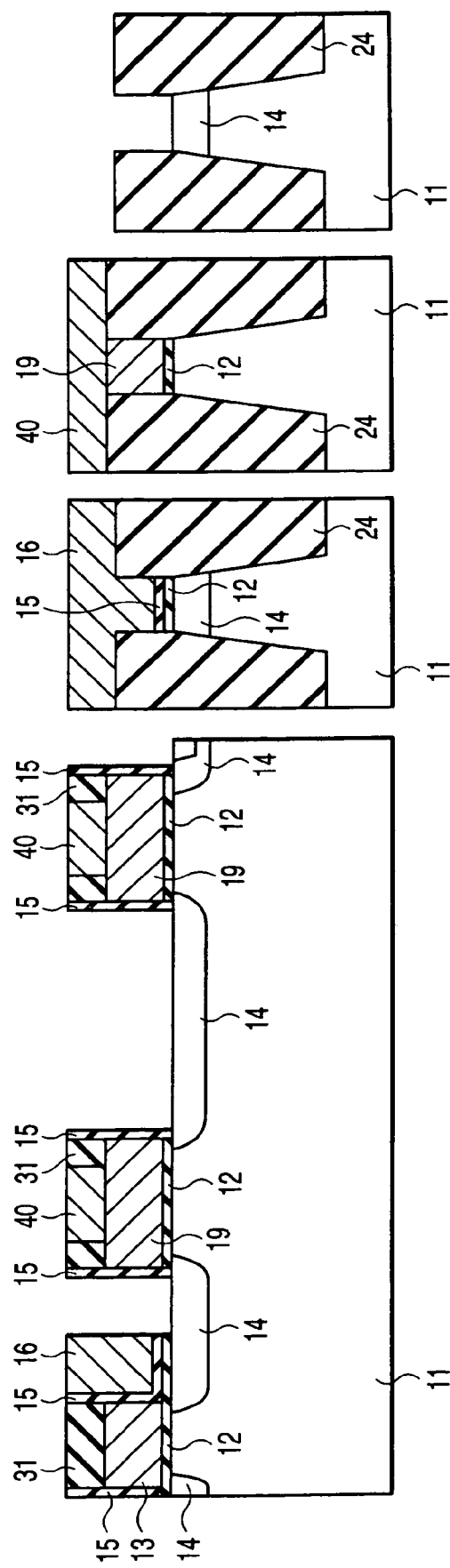

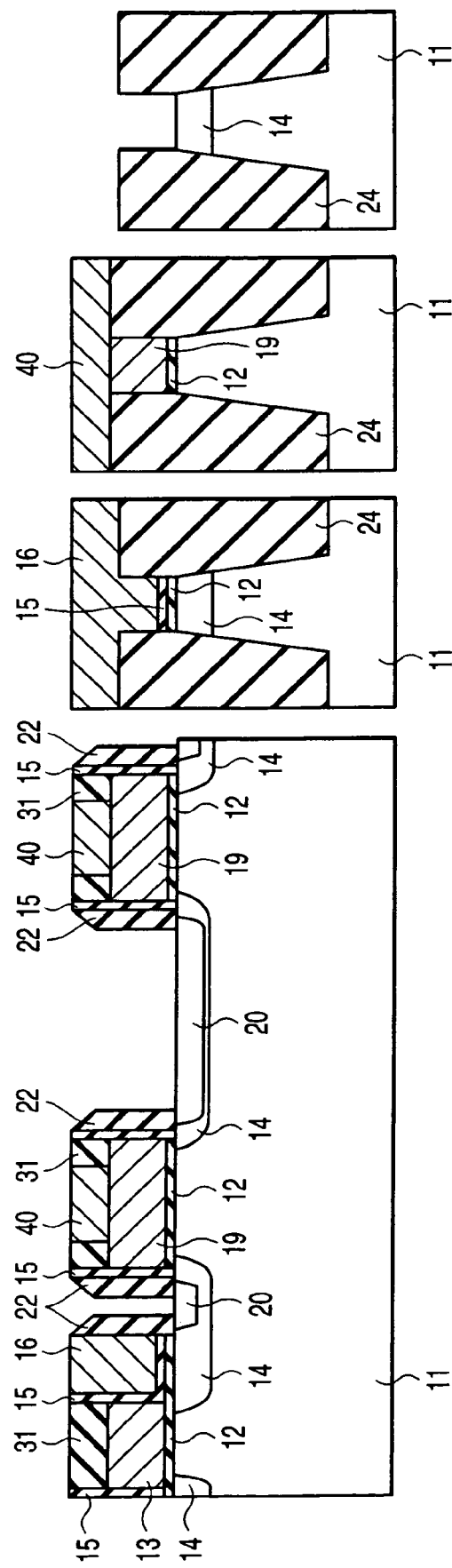

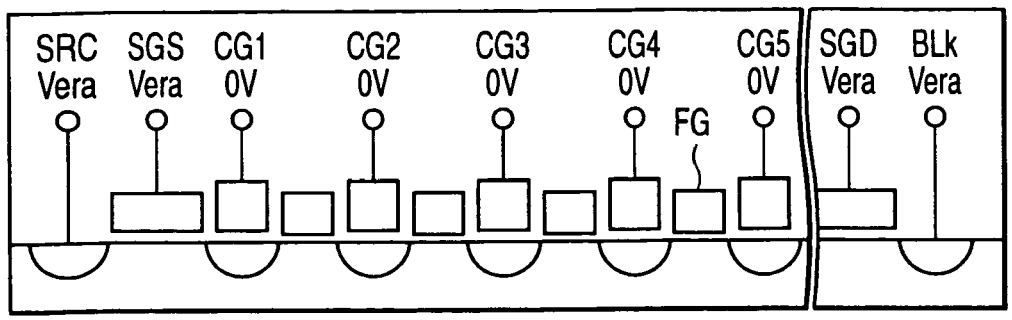
F I G. 6 7
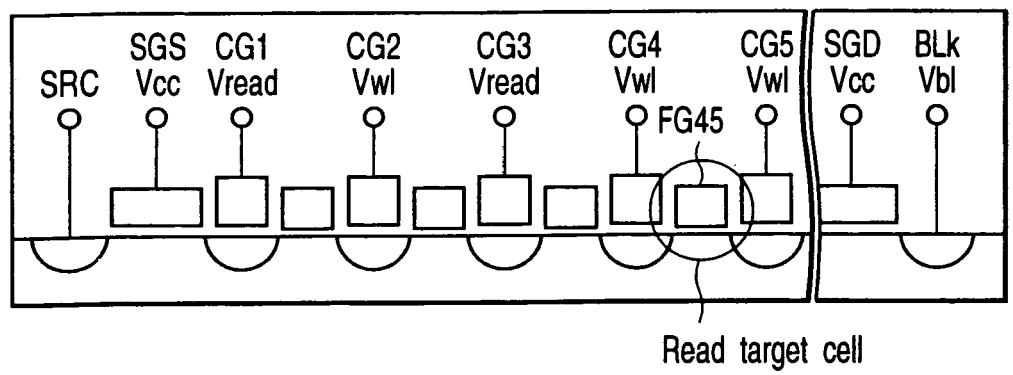
F I G. 6 8
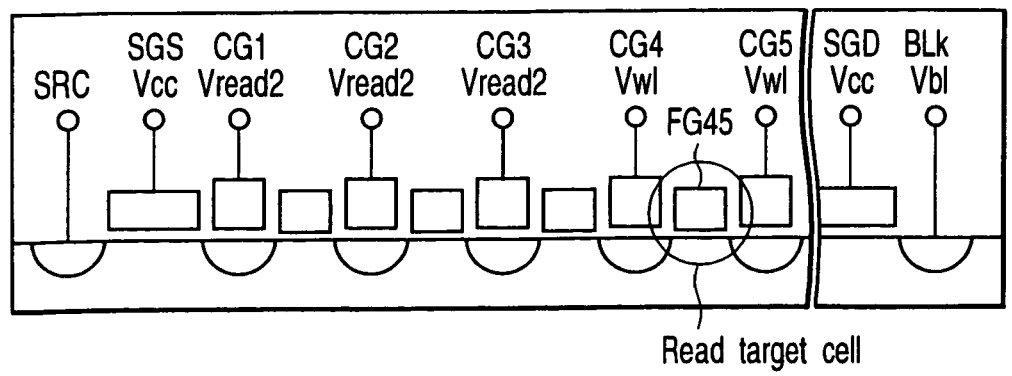
F I G. 6 9

NONVOLATILE SEMICONDUCTOR MEMORY DEVICE

CROSS-REFERENCE TO RELATED APPLICATIONS

This application is a continuation of and claims the benefit of priority from U.S. application Ser. No. 10/873,296, filed Jun. 23, 2004 now U.S. Pat. No. 7,064,379 and is based upon and claims the benefit of priority from prior Japanese Patent Applications No. 2003-178418, filed Jun. 23, 2003, and No. 2004-158884, filed May 28, 2004, the entire contents of all of which are incorporated herein by reference.

BACKGROUND OF THE INVENTION

1. Field of the Invention

This invention relates to a nonvolatile semiconductor memory device having a multilayer gate structure including a floating gate and a control gate.

2. Description of the Related Art

FIGS. 1 through 3 illustrates a known NAND type EEPROM realized by utilizing shallow trench isolation (STI). FIG. 1 is a schematic plan view and FIGS. 2 and 3 are two different cross-sectional views of FIG. 1.

As shown in FIG. 2, a gate insulation film GI, which is a tunneling insulation film, is formed on a silicon substrate (Si-sub) and floating gates FG are formed thereon. The floating gates FG of adjacent cells are separated and electrically insulated from each other. The structure that separates adjacently located floating gates FG apart from each other is referred to as a slit. The floating gates FG between a pair of slits are covered at the top and the opposite lateral sides by an inter-gate insulation film IGI. Each floating gate FG can be made to hold an electric charge for a long period because it is covered by a tunneling insulation film and an inter-gate insulation film.

A control gate CG is formed on the inter-gate insulation film. Normally, a control gate CG is shared by a large number of cell transistors and adapted to drive the number of cell transistors simultaneously. The control gate CG is also referred to as word line WL.

On the other hand, the cross-sectional view of FIG. 3 is taken along a bit line BL. Stacked gate structures illustrated in FIG. 3 are arranged on the substrate in rows along the direction of bit lines BL. Each cell transistor is processed in a self-aligning manner by means of resist or a processing mask layer. In the NAND type memory device where a number of cells are connected in series by way of select gates, adjacent cells share a source and a drain in order to reduce the area occupied by each cell. Each word line WL and the gap separating adjacent word lines WL are formed with minimum feature size by micro-processing.

Electrons are injected into a floating gate FG by applying a high write potential to the corresponding control gate CG and grounding the substrate. As cell transistors are micronized, an increased parasitic capacitance appears between adjacent cells and between a floating gate FG and a peripheral structure. For this reason, there is a tendency of raising the write voltage of cell transistors for the purpose of increasing the data writing rate. Control gates CG need to be reliably insulated from each other and word line drive circuits are required to withstand high voltages when a high voltage is used for the write voltage. This poses a problem when arranging memory elements at high density and driving them to operate at high speed.

It is possible to roughly estimate the potential required for write operation by seeing the structure shown in FIGS. 1 and 3. The control gate CG and the floating gate FG and the floating gate FG and the substrate can be regarded as capacitors where the gate insulation film and the tunneling insulation film are respectively sandwiched. In other words, as seen from the control gate CG, the memory cell is equivalent to a structure where two capacitors are connected in series.

FIG. 4 is an equivalent circuit diagram of a cell that is obtained when the capacitance of the capacitor between the control gate CG and the floating gate FG is Cip and the capacitance of the capacitor between the floating gate FG and the substrate is Ctox. The electric potential Vfg of the floating gate FG when a high write potential (Vpgm=Vcg) is applied to the control gate CG is defined by Cip and Ctox and can be roughly estimated by using the formula below:

$$Vfg = Cr \times (Vcg - Vt + Vt0),$$

where Cr=Cip/(Cip+Ctox) and Vt represents the threshold voltage of the cell transistor while Vto represents the threshold voltage (neutral threshold voltage) when the floating gate FG is totally free from electric charge.

The higher the electric potential Vfg of the floating gate FG, the stronger the electric field applied to the tunneling insulation film so injection of electrons into the floating gate FG can easily take place. It will be appreciated from the above formula that the value of Vfg can be raised by increasing the capacitance ratio (Cr) provided that Vcg is held to a constant level. In other words, it is necessary to make Cip have a large value relative to Ctox in order to reduce the write voltage.

The capacitance of a capacitor is proportional to the dielectric constant of the thin film arranged between the electrodes and the area of the opposed electrodes and inversely proportional to the distance between the opposed electrodes. A write/erase operation is obstructed when a leak current flows through the tunneling insulation film for allowing an electric charge to pass through for the purpose of the write/erase operation. Therefore, a technique of increasing the contact area of the gate insulation film and the floating gate FG and that of the gate insulation film and the control gate CG is normally used to increase the value of Cip. Techniques such as increasing the top surface of the floating gate FG by reducing the width of the slit (dimension 1a in FIG. 2) and increasing the length of the lateral walls of the floating gate FG (dimension 1b in FIG. 2) by increasing the film thickness of the floating gate FG have been developed to date.

However, when such a technique is used, the slit needs to be extremely micronized relative to the dimensions of the gate and the wiring materials and the difficulty of forming the gate increases as the floating gate FG is made thicker. Additionally, the parasitic capacitance between FG-FG increases as a result of micronization. In short, it obstructs micronization of cell transistors to maintain the capacitance ratio.

It is conceivable to reduce the write voltage by modifying the configuration of the floating gate FG and the control gate CG.

As a matter of fact, Japanese Laid-Open Patent (Kokai) No. 11-145429 describes a NAND type EEPROM that is designed to allow write/erase/read operations to be performed with a low voltage by increasing the capacitance between booster plates.

Japanese Laid-Open Patent (Kokai) No. 2002-217318 describes a nonvolatile memory device including micronized elements that are realized by raising the coupling ratio of the floating gate and the control gate and thereby reducing the write voltage.

Japanese Laid-Open Patent (Kokai) No. 2.002-50703 describes a nonvolatile semiconductor memory device including MOSFETs that show improved write/erase/read characteristics and area realized by forming floating gate at opposite lateral sides of each control gate.

Furthermore, Y. Sasago et al. "10-MB/s Multi-Level Programming of Gb-Scale Flash Memory Enabled by New AG-AND Cell Technology". 2002 IEEE IEDM, pp. 952-954 describes an AG-AND memory cell where an assist gate is arranged adjacent to a floating gate.

However, it is still difficult to increase the capacitance between the control gate and the floating gate by means of the above described prior art. In other words, it is difficult to reduce the write voltage and realize a highly integrated memory that operates at high speed by means of the prior art. Therefore, nonvolatile semiconductor memory devices that can reduce the write voltage, has high capacity and realize a high speed operation.

Further, selection transistors are processed with cell transistors, simultaneously. Therefore, the gate insulation film and the diffusion layer which is the source or drain region of the selection transistors cannot be formed separately with the gate insulation film and the diffusion layer which is the source or drain region of the cell transistors. As the result, characteristics of the selection transistors, such as cut-off characteristics at a write/read time are set dependently being influenced by an ion dose amount during the forming of the diffusion layer and a thickness of the gate insulation film.

BRIEF SUMMARY OF THE INVENTION

According to an aspect of the present invention, there is provided a nonvolatile semiconductor memory device including: a memory cell including a floating gate formed on a semiconductor substrate via a first gate insulation film, a pair of diffusion layers which are source or drain regions positioned on the opposite sides of the floating gate and formed in the substrate, first and second control gates formed on the opposite sides of the floating gate to drive the floating gate, and an inter-gate insulation film formed between at least the first and second control gates and the floating gate; and a selection transistor for selecting the memory cell, including a selection gate formed on the substrate via a second gate insulation film, and a pair of second diffusion layers which are formed in the substrate positioned on the opposite sides of the selection gate and one of which is electrically connected to one of the pair of first diffusion layers and which are source or drain regions.

BRIEF DESCRIPTION OF THE SEVERAL VIEWS OF THE DRAWING

FIG. 1 is a plan view showing an example of a conventional nonvolatile semiconductor memory device;

FIG. 2 is a cross-sectional view of FIG. 1;

FIG. 3 is another cross-sectional view of FIG. 1;

FIG. 4 is an equivalent circuit diagram of FIG. 1;

FIGS. 12A and 12B are cross-sectional views showing a step subsequent to FIGS. 11A and 11B;

FIGS. 13A and 13B are cross-sectional views showing a step subsequent to FIGS. 12A and 12B;

FIG. 20 is a sectional view showing a constitution of a part of the cell array in the nonvolatile semiconductor memory device according to a second embodiment;

FIGS. 33A to 33D are cross-sectional views showing a first step of a method of manufacturing the nonvolatile semiconductor memory device according to the fourth embodiment;

FIGS. 36A to 36D are cross-sectional views showing a step subsequent to FIGS. 35A to 35D;

FIGS. 37A to 37D are cross-sectional views showing a step subsequent to FIGS. 36A to 36D;

FIGS. 40A to 40D are cross-sectional views showing a step subsequent to FIGS. 39A to 39D;

FIGS. 44A to 44D are cross-sectional views showing a step subsequent to FIGS. 43A to 43D;

FIGS. 45A to 45D are cross-sectional views showing a step subsequent to FIGS. 44A to 44D;

FIGS. 48A to 48D are cross-sectional views showing a first step of a method of manufacturing the nonvolatile semiconductor memory device according to the fifth embodiment;

FIGS. 50A to 50D are cross-sectional views showing a step subsequent to FIGS. 49A to 49D;

FIGS. 51A to 51D are cross-sectional views showing a step subsequent to FIGS. 50A to 50D;

FIGS. 52A to 52D are cross-sectional views showing a step subsequent to FIGS. 51A to 51D;

FIGS. 53A to 53D are cross-sectional views showing a step subsequent to FIGS. 52A to 52D;

FIGS. 54A to 54D are cross-sectional views showing a step subsequent to FIGS. 53A to 53D;

FIGS. 55A to 55D are cross-sectional views showing a step subsequent to FIGS. 54A to 54D;

FIGS. 56A to 56D are cross-sectional views showing a step subsequent to FIGS. 55A to 55D;

FIGS. 57A to 57D are cross-sectional views showing a step subsequent to FIGS. 56A to 56D;

FIG. 67 is a diagram showing an example of the potential applied to each part in a case where the data is erased in the nonvolatile semiconductor memory device according to the first to fifth embodiments;

FIG. 68 is a diagram showing an example of the potential applied to each part in a case where the data is read in the nonvolatile semiconductor memory device according to the first to fifth embodiments; and FIG. 69 is a diagram showing another example of the potential applied to each part in a case where the data is read in the nonvolatile semiconductor memory device according to the first to fifth embodiments.

DETAILED DESCRIPTION OF THE INVENTION

The present invention will be described hereinafter in accordance with embodiments.

First Embodiment

Figure 5:
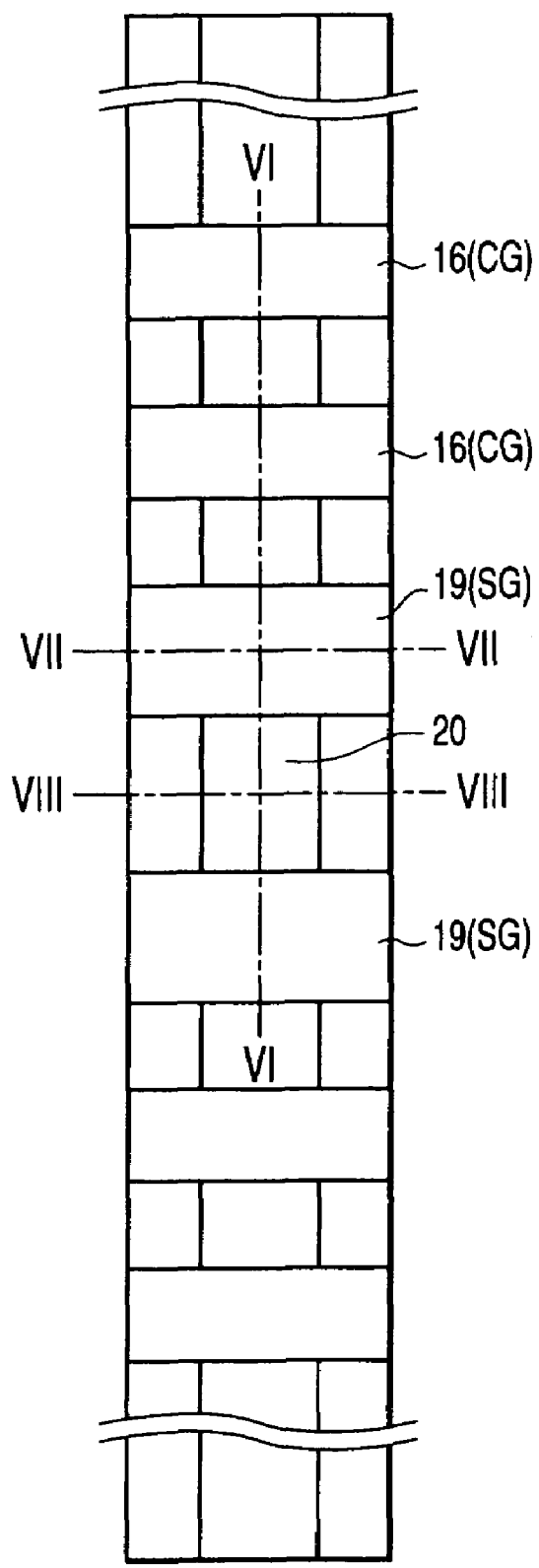
FIG. 5 is a plan view showing a constitution of a part of a cell array in the nonvolatile semiconductor memory device according to a first embodiment.
Figure 6:
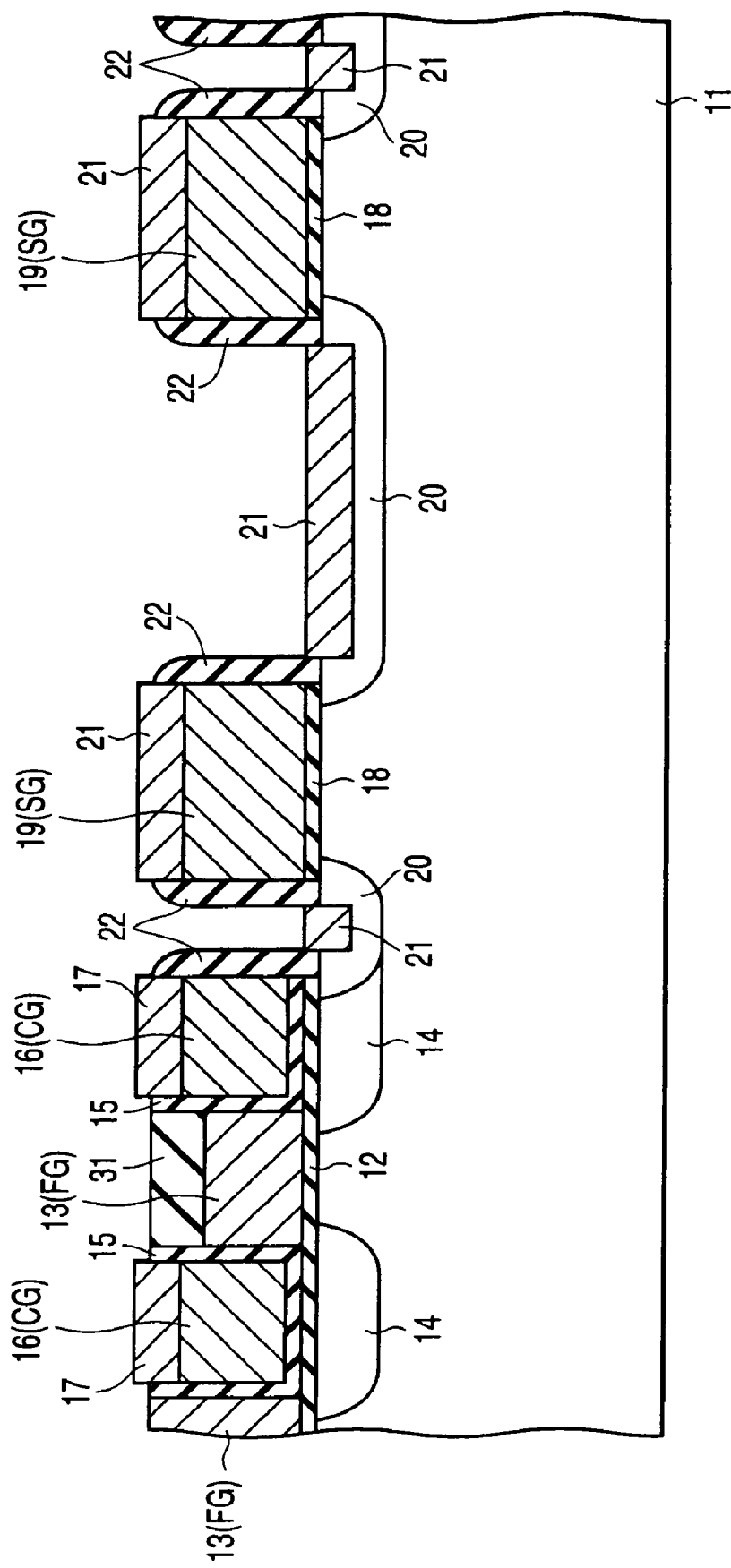
FIG. 6 is a cross-sectional view of FIG. 5.
Figure 7:
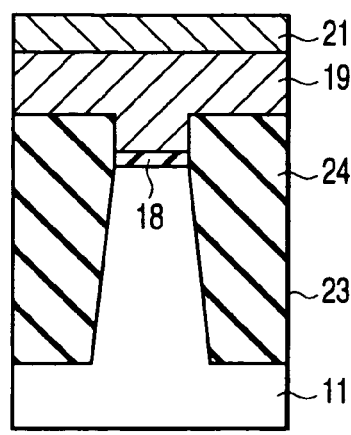
FIG. 7 is another cross-sectional view of FIG. 5.
Figure 8:
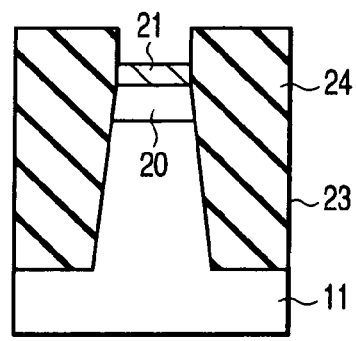
FIG. 8 is a still another cross-sectional view of FIG. 5.

FIGS. 5 to 8 show a constitution of a part of a cell array in a nonvolatile semiconductor memory device according to a first embodiment. FIG. 5 is a plan view of the cell array, and FIGS. 6 to 8 are cross-sectional views showing different sections of FIG. 5.

A cell array according to the first embodiment comprises a plurality of cell transistors connected in series to one another to constitute a memory cell array, and a selection transistor for selecting the cell transistor, connected to the memory cell array.

In each cell transistor, a floating gate 13 (FG) formed on a silicon semiconductor substrate 11 via a gate insulation film 12, a pair of diffusion layers 14 which are source or drain regions positioned on opposite sides of the floating gate 13 and formed in the substrate 11, and first and second control gates 16 formed on the opposite sides of the floating gate 13 via inter-gate insulation films 15 are disposed. The inter-gate insulation films 15 are extended and formed between the first and second control gates 16 and the pair of diffusion layers 14. The gate insulation film 12 is extended and formed between the first and second control gates 16 and the pair of diffusion layers 14 so that the film 12 is positioned under the inter-gate insulation films 15. Furthermore, metal salicide layers 17 are formed on the first and second control gates 16.

In the selection transistor, a selection gate (SG) 19 formed via a gate insulation film 18 which is different from the gate insulation film 12, and a pair of diffusion layers 20 which are source or drain regions positioned on the opposite sides of the selection gate 19 and formed in the substrate 11 are disposed on the silicon semiconductor substrate 11. Moreover, in the pair of diffusion layers 20, the diffusion layer 20 on a memory cell side is electrically connected to and integrated with the diffusion layer 14 which is the source or drain region on the memory cell side. Furthermore, metal salicide layers 21 are formed on the surfaces of the pair of diffusion layers 20 and selection gate 19. Spacers 22 made of insulation materials are formed on sidewalls of the selection gate 19 and a sidewall of the control gate 16 adjacent to the selection gate 19. This spacer 22 may comprise a single layer of the insulation film, or a plurality of layers of insulation films.

As shown in FIGS. 7 and 8, a shallow trench 23 for shallow trench isolation (STI) extended in parallel with an arrangement direction of the diffusion layers 14, 20 are formed in the substrate 11, and an insulation film 24 for isolating devices is buried in the trench 23 to isolate a plurality of memory cell arrays from one another.

A floating gate has heretofore been driven by a control gate in the cell. On the other hand, in the memory cell in the first embodiment, the floating gate 13 is driven by two control gates 16 positioned on the opposite sides of the floating gate.

Figure 9:
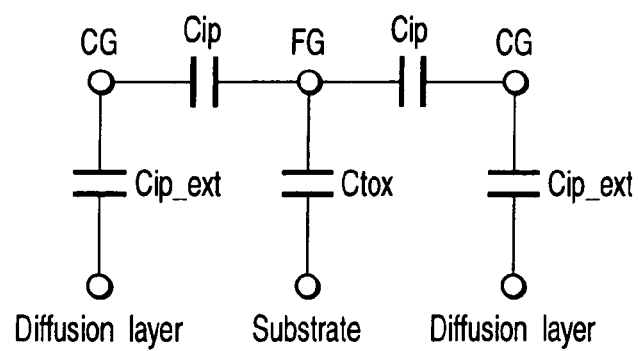
FIG. 9 is an equivalent circuit diagram of a cell of the first embodiment.

FIG. 9 shows an equivalent circuit of the cell of the first embodiment. Here, Cip represents a capacitance between two control gates CG and a floating gate FG, Cip_ext represents a capacitance between two control gates CG and the substrate, and Ctox represents a capacitance between the floating gate FG and the substrate. In this equivalent circuit, assuming that two control gates CG adjacent to the floating gate FG have an equal potential (Vcg), a capacitance ratio (Cr) which determines a potential Vfg of the floating gate is roughly estimated by the following equation:

$$Cr = Cip/(Cip + Ctox)$$
$$= \left(2 \cdot \varepsilon ip \cdot W \cdot \frac{Tfg}{Tip}\right) / \left(\left(2 \cdot \varepsilon ip \cdot W \cdot \frac{Tfg}{Tip}\right) + \varepsilon tox \cdot W \cdot L/Ttox\right),$$

where $\varepsilon ip$ represents a permittivity of the inter-gate insulation film, $\varepsilon tox$ represents a permittivity of the gate insulation film, W represents a channel width of the cell transistor, L represents a gate length of the cell transistor, Tfg represents a film thickness of the floating gate FG, Ttox represents a film thickness of the gate insulation film, and Tip represents a film thickness of the inter-gate insulation film.

It is seen from the above equation that Cr can be increased by increasing the film thickness Tfg of the floating gate without changing the channel width or the gate length of the transistor which should be a minimum design dimension in the cell transistor of the present embodiment. This means that the capacitance ratio can be improved, even when the cell is micronized.

Moreover, as shown in FIG. 6, a space between the floating gates 13 is substantially completely filled with the control gate 16. Therefore, a coupling capacitance between the floating gates adjacent to each other in a word line WL direction, which has heretofore been a problem in the cell, and a fringe capacitance between the substrate in which the source/drain region of the cell transistor is formed and the floating gate, that is, two parasitic capacitances are substantially shielded.

From the above, in the cell transistor of the first embodiment, the capacitance ratio can be secured by increasing the film thickness of the floating gate without considering any increase of the parasitic capacitance. As a result, even when the gate length or the channel width of the cell transistor is micronized, the capacitance ratio can be increased. Additionally, since the capacitance ratio can be increased, a write voltage can be reduced. Therefore, according to the first embodiment, the micronizing of the cell transistor and the reducing of the write voltage can be simultaneously satisfied.

Furthermore, a gate insulation film which is different from the gate insulation film 12 on a cell transistor is used as the gate insulation film 18 of the selection transistor. Therefore, the film thickness of the gate insulation film 18 can be adjusted independently of the gate insulation film 12 of the cell transistor. Additionally, the diffusion layer 20 which is the source or drain region of the selection transistor is different from the diffusion layer 14 which is the source or drain region of the cell transistor. Therefore, an ion dose amount during the forming of the diffusion layer 20 can be adjusted independently of the diffusion layer 14 of the cell transistor. As a result, characteristics of the selection transistor, such as cut-off characteristics at a write/read time can be set independently without being influenced by the cell transistor.

FIGS. 10A and 10B to 19A and 19B show a method of manufacturing the nonvolatile semiconductor memory device according to the first embodiment in order of steps. It is to be noted that each figure A corresponds to a cross-sectional view of FIG. 6, and each figure B corresponds to a cross-sectional view of FIG. 8.

Figures 10A, 10B:
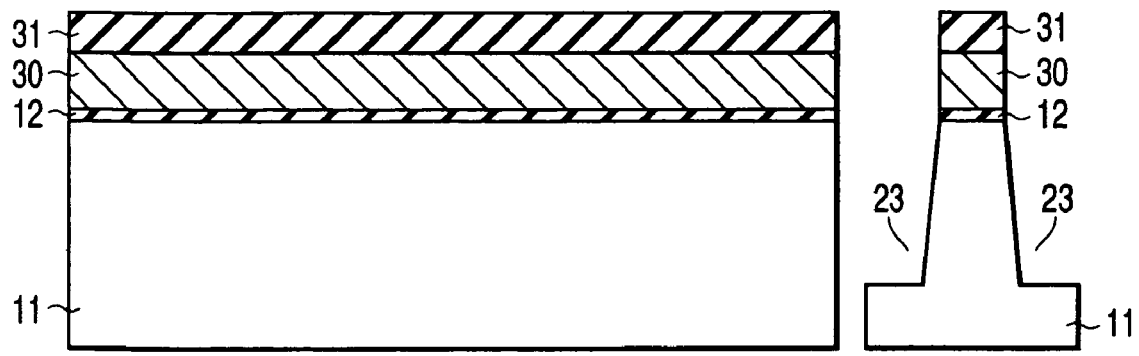
FIGS. 10A and 10B are cross-sectional views showing a first step of a method of manufacturing a nonvolatile semiconductor memory device according to the first embodiment.

First, as shown in FIGS. 10A and 10B, the gate insulation film 12 formed, for example, of silicon oxide is formed on the silicon semiconductor substrate 11. For example, a polysilicon layer 30 and a mask layer 31 are successively formed on the gate insulation film 12 to constitute the floating gate. For example, a silicon oxide film or a silicon nitride film is applied to the mask layer 31. The mask layer 31 has a minimum condition that a selectivity to the polysilicon layer 30 is obtained in etching the polysilicon layer 30. However, it is more preferable that a selectivity to the insulation film for the burying be obtained in a chemical mechanical polishing (CMP) step during the forming of STI described later and that a selectivity to the control gate be obtained in the CMP step during the forming of the control gate. Thereafter, the mask layer 31 is patterned by a lithography step and a selective etching step. The polysilicon layer 30, gate insulation film 12, and substrate 11 are successively etched using the patterned mask layer 31 to form the shallow trench 23 for isolating the devices.

Figures 11A, 11B:
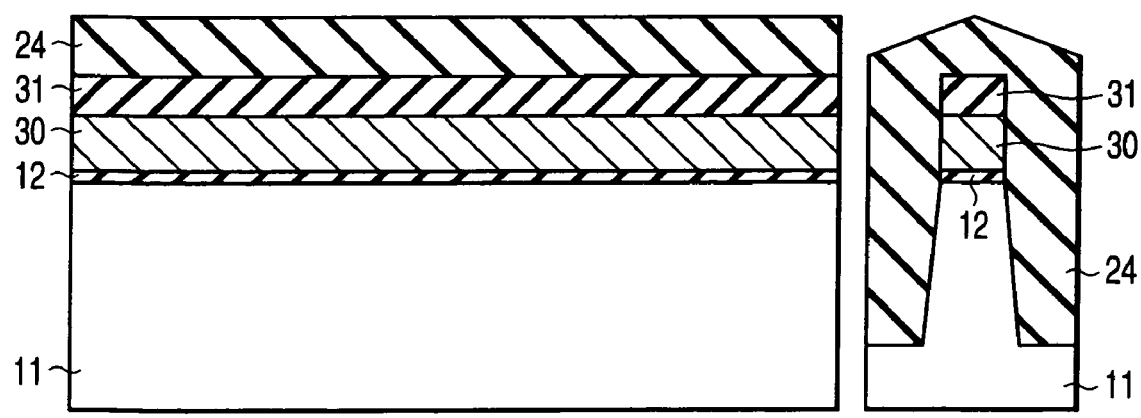
FIGS. 11A and 11B are cross-sectional views showing a step subsequent to FIGS. 10A and 10B.

Next, as shown in FIGS. 11A and 11B, the insulation film 24 formed, for example, of a silicon oxide film is formed on the whole surface, for example, by chemical vapor deposition (CVD) to fill the trench 23 formed in the substrate 11. Subsequently, as shown in FIGS. 12A and 12B, the insulation film 24 is polished down to the mask layer 31 by the CMP step using the mask layer 31 as a stopper, and the STI is formed.

Subsequently, as shown in FIGS. 13A and 13B, the lithography step and the selective etching step are performed to etch the polysilicon layer 30. As a result, the floating gate 13 is formed. At this time, only the gate insulation film 12 remains in a region where a selection gate is to be formed. Thereafter, in a state in which the region scheduled to form the selection gate is masked by a mask layer, impurity ions are injected into the substrate 11 using the floating gate 13 as the mask, and the diffusion layers 14 are formed to constitute the source/drain regions (S/D) of the cell transistor.

Figures 14A, 14B:
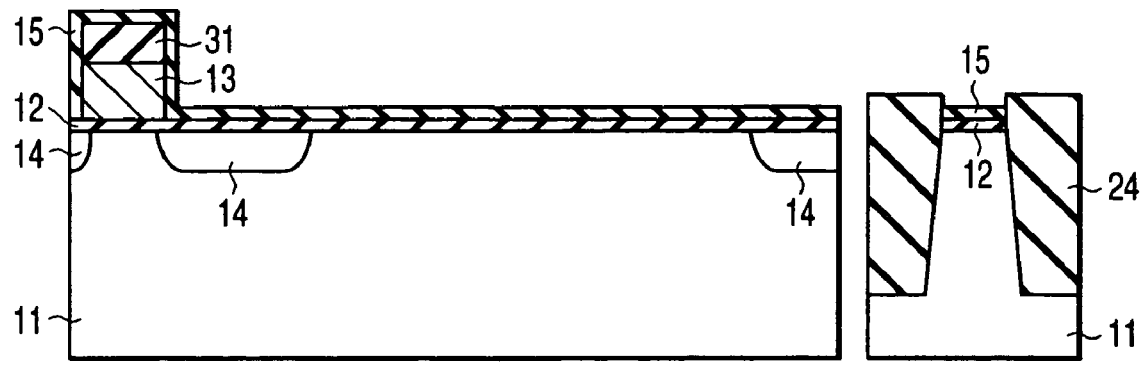
FIGS. 14A and 14B are cross-sectional views showing a step subsequent to FIGS. 13A and 13B.

Thereafter, as shown in FIGS. 14A and 14B, the inter-gate insulation film 15 is formed on the whole surface. The inter-gate insulation film 15 is formed, for example, by any one of silicon oxide, silicon nitride, aluminum oxide, hafnium oxide, and zirconium oxide, or a stacked film of at least two of them. As an example, a so-called ONO film of three layers including silicon oxide, silicon nitride, and silicon oxide may be used.

Figures 15A, 15B:
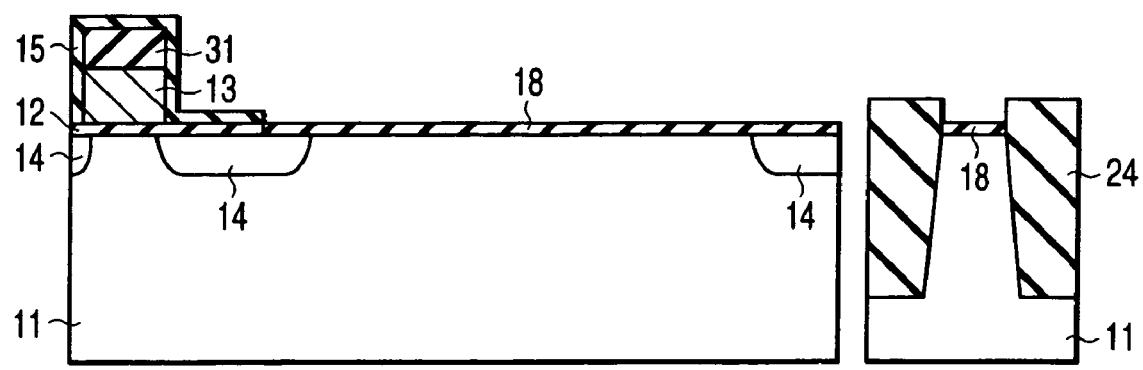
FIGS. 15A and 15B are cross-sectional views showing a step subsequent to FIGS. 14A and 14B.

Thereafter, as shown in FIGS. 15A and 15B, the inter-gate insulation films 15 and the gate insulation film 12 in and around the region scheduled to form the selection gate are removed, and the gate insulation film 18 formed of silicon oxide is newly formed in the removed region. The gate insulation film 18 has a film thickness different from that of the gate insulation film 12 of the cell transistor.

Figures 16A, 16B:
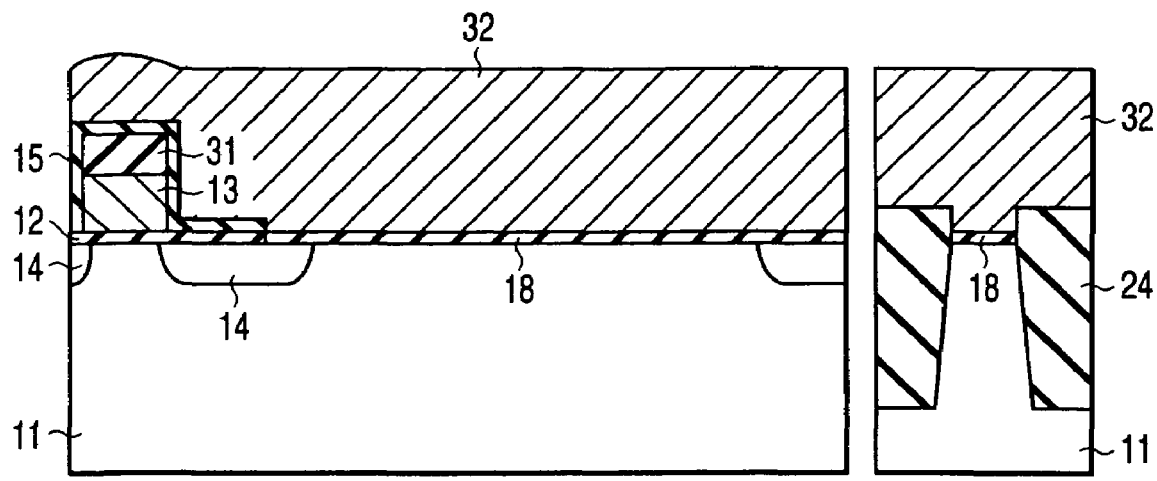
FIGS. 16A and 16B are cross-sectional views showing a step subsequent to FIGS. 15A and 15B.
Figures 17A, 17B:
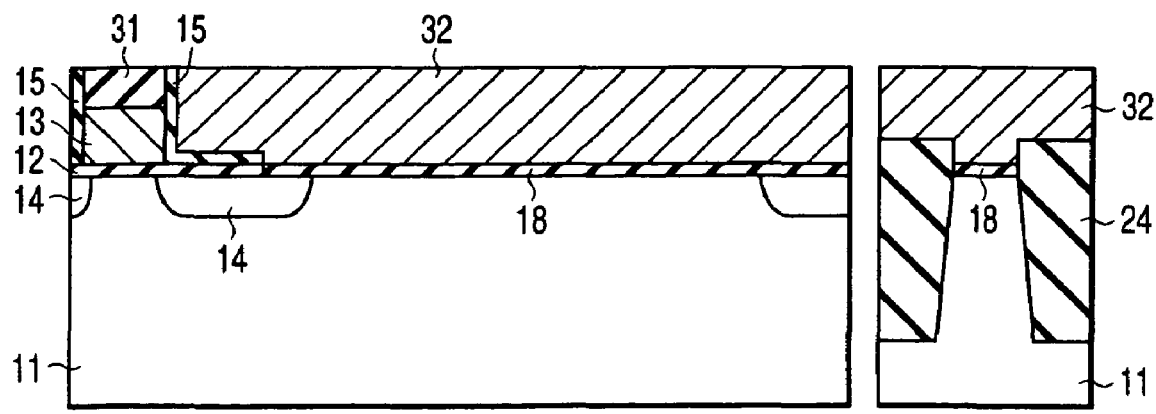
FIGS. 17A and 17B are cross-sectional views showing a step subsequent to FIGS. 16A and 16B.

Subsequently, as shown in FIGS. 16A and 16B for example, a polysilicon layer 32 is formed on the whole surface by the CVD to constitute the control gate and the selection gate. Next, as shown in FIGS. 17A and 17B, the polysilicon layer 32 is polished down to the mask layer 31 on the floating gate 13 by the CMP step, and flatted.

Figures 18A, 18B:
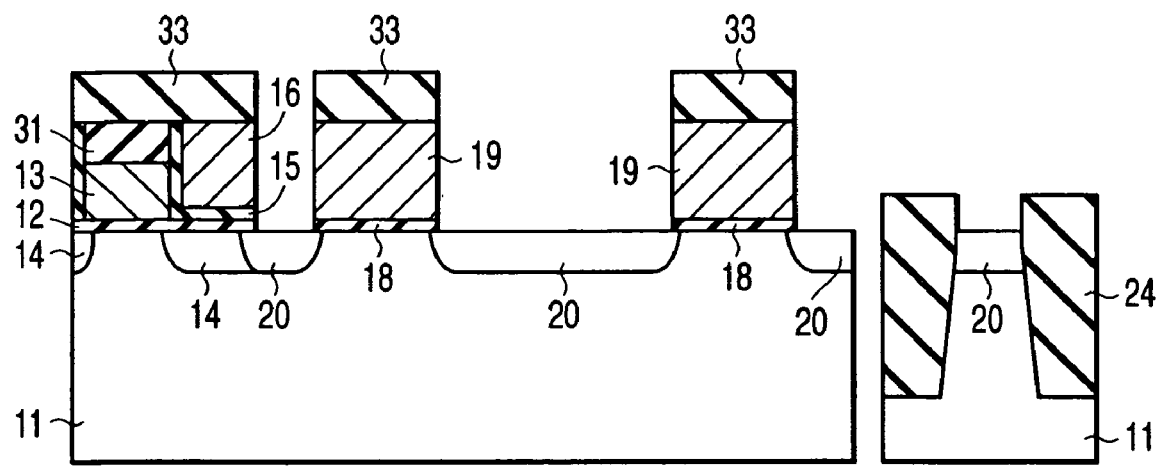
FIGS. 18A and 18B are cross-sectional views showing a step subsequent to FIGS. 17A and 17B.

Next, as shown in FIGS. 18A and 18B, a resist layer 33 is deposited on the whole surface, the lithography step and the selective etching step are performed, and the polysilicon layer 32 and the gate insulation film 12 disposed under the polysilicon layer are etched using the patterned resist layer 33 as a mask. As a result, the control gates 16 and the selection gate 19 are simultaneously formed. Subsequently, the impurity ions are injected into the substrate 11 using the selection gate 19 and the adjacent control gate 16 as the mask, and the diffusion layers 20 are formed to constitute the source/drain regions (S/D) of the selection transistor. The dose amount and an acceleration energy of ions during the ion injection are adjusted so that desired characteristics of the selection transistor are obtained.

Figures 19A, 19B:
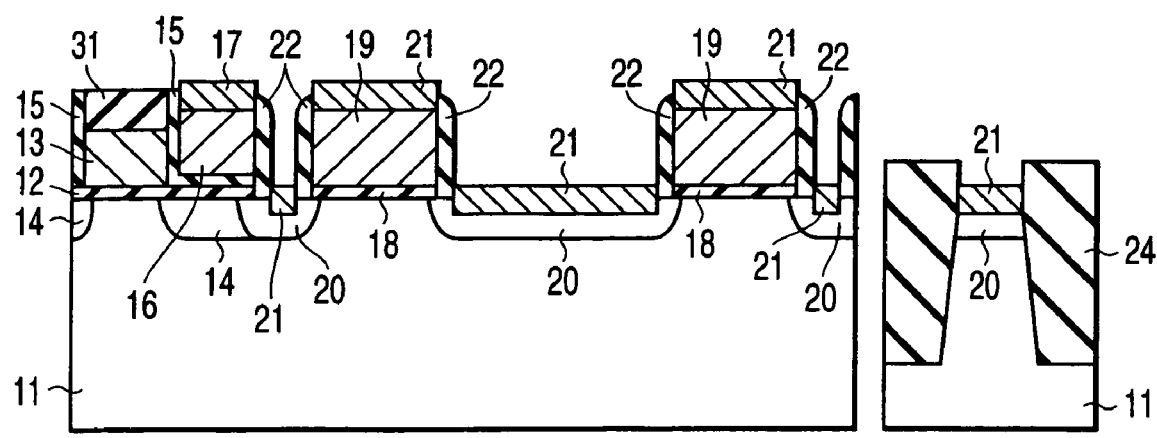
FIGS. 19A and 19B are cross-sectional views showing a step subsequent to FIGS. 18A and 18B.

Subsequently, as shown in FIGS. 19A and 19B, after the whole surface of the resist layer 33 is removed, an insulation material for forming the spacer is deposited on the whole surface, and thereafter etched by the RIE, and the spacers 22 are formed on the sidewalls of the selection gate 19 and on the sidewall of the control gate 16 adjacent to the selection gate 19. As described above, this spacer 22 may comprise a single insulation film, or a plurality of layers of insulation films. In this case, since a space between the selection gate 19 and the adjacent control gate 16 is sufficiently large, the space is not completely filled with the spacer 22, and the diffusion layer 20 is exposed in this portion. It is to be noted that after forming the spacer 22, the impurity ions are injected again, and the diffusion layer 20 constituting the source/drain region (S/D) of the selection transistor may be formed in a lightly doped drain (LDD) structure.

Next, the whole surface on which a metal thin film has been deposited is heated, and the mask layer 31 is used as a control film of a salicide reaction. Accordingly, the metal salicide layer 17 is formed on the control gate. 16, and metal salicide layers 21 are formed on the selection gate 19 and on the surface of the diffusion layer 20. Non-reacted metal thin films are thereafter removed.

Thereafter, an interlayer insulation film is deposited on the whole surface, contact holes are further made in the interlayer insulation film positioned between the pair of selection gates 19, and contacts electrically connected to the metal salicide layers 21 are formed.

It is to be noted that a case where the control gate 16 has a salicide structure has been described, but in the present embodiment, the control gate 16 is formed in a self-aligning manner with respect to the floating gate 13, and therefore a metal wiring may also be formed on the upper surface of the control gate 16. Furthermore, the control gate 16 itself may also be formed of a metal material. In this embodiment, the following materials are applicable to the control gate 16 and the selection gate 19.

Examples of a metal material applied to the salicide structure include titanium, cobalt, and nickel. Moreover, when the control gate 16 and the selection gate 19 are formed of metal materials, for example, a stacked film of any one or at least two of titanium, tungsten, tungsten nitride, and titanium nitride are applicable.

In the present embodiment, the control gates 16 are formed on the opposite side surfaces of the floating gate 13 via the inter-gate insulation films 15. Therefore, capacitive coupling of the floating gate 13 and control gates 16 increases as compared with the prior art. Therefore, the wiring of the control gate 16 needs to be a material having a sufficiently low resistance value, and the metal salicide layer 17 formed on the control gate is useful for lowering the wiring resistance value of the control gate 16. The selection gate 19 and the adjacent control gate 16 are simultaneously processed. Therefore, a distance between the gates can be held to be constant without being influenced by mask alignment shift at an exposure time, and it is easy to control the parasitic capacitance between the control gate 16 and the selection gate 19.

Second Embodiment

FIG. 20 shows a constitution of a part of the cell array in a nonvolatile semiconductor memory device according to a second embodiment, and corresponds to a cross-sectional view of FIG. 6 in the first embodiment. It is to be noted that in FIG. 20, portions corresponding to those of FIG. 6 are denoted with the same reference numerals, and the description is omitted.

In the cell array according to the first embodiment, the case has been described where the space between the selection gate 19 and the adjacent control gate 16 is sufficiently broadened and the space is not completely filled with the spacer 22 and the diffusion layer 20 is exposed in this portion and the metal salicide layer 21 is formed on the surface of the diffusion layer.

On the other hand, in the second embodiment, the space between the selection gate 19 and the adjacent control gate 16 is narrowed, the space is filled with the spacer 22, and the diffusion layer 20 is not exposed. Therefore, the metal salicide layer 21 is not formed on the surface of the diffusion layer 20 in the portion filled with the spacer 22. As shown in FIG. 20, an air gap 34 may also be formed in the spacer 22 buried in the space between the selection gate 19 and the adjacent control gate 16. Since the air gap 34 is formed, the parasitic capacitance between the control gate 16 and the selection gate 19 can be reduced.

Even in the second embodiment, when the film thickness of the floating gate is increased without considering any increase of the parasitic capacitance, the capacitance ratio can be secured. As a result, even when the gate length or the channel width of the cell transistor is micronized, the capacitance ratio can be increased. Additionally, since the capacitance ratio can be increased, the write voltage can be reduced. Therefore, according to the second embodiment, the micronizing of the cell transistor and the reducing of the write voltage can be simultaneously satisfied.

Furthermore, the gate insulation film 18 which is different from the gate insulation film 12 of the cell transistor is used as the gate insulation film of the selection transistor. Therefore, the film thickness of the gate insulation film 18 can be adjusted independently of the gate insulation film 12 of the cell transistor. Additionally, the diffusion layer 20 which is the source or drain region of the selection transistor is different from the diffusion layer 14 which is the source or drain region of the cell transistor. Therefore, the ion dose amount during the forming of the diffusion layer 20 can be adjusted independently of the diffusion layer 14 of the cell transistor. As a result, the characteristics of the selection transistor, such as the cut-off characteristics at the write/read time, can be set independently without being influenced by the cell transistor.

Next, a method of manufacturing the nonvolatile semiconductor memory device according to the second embodiment will be described. The steps of FIGS. 10A and 10B to 17A and 17B are similar to those of the first embodiment.

Figures 21A, 21B:
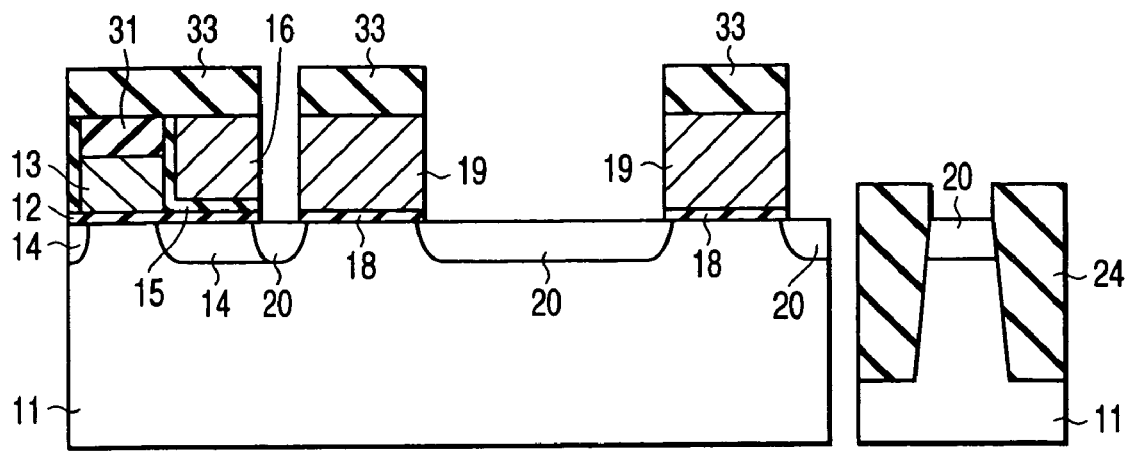
FIGS. 21A and 21B are cross-sectional views showing a first step of a method of manufacturing the nonvolatile semiconductor memory device according to the second embodiment.

Next, as shown in FIGS. 21A and 21B, the resist layer 33 is deposited on the whole surface, and the resist layer 33 is patterned. During the patterning, the resist layer is patterned in such a manner that the space between the selection gate 19 and the adjacent control gate 16 is smaller than that in the first embodiment. Subsequently, the polysilicon layer 32 and the gate insulation film 18 etched using the patterned resist layer 33 as a mask. As a result, the control gate 16 and the selection gate 19 are formed. Subsequently, the impurity ions are injected into the substrate 11 using the selection gate 19 and the adjacent control gate 16 as the mask, and a pair of diffusion layers 20 are formed. The dose amount and the acceleration energy of ions during the ion injection are adjusted in such a manner that desired characteristics of the selection transistor are obtained.

Figures 22A, 22B:
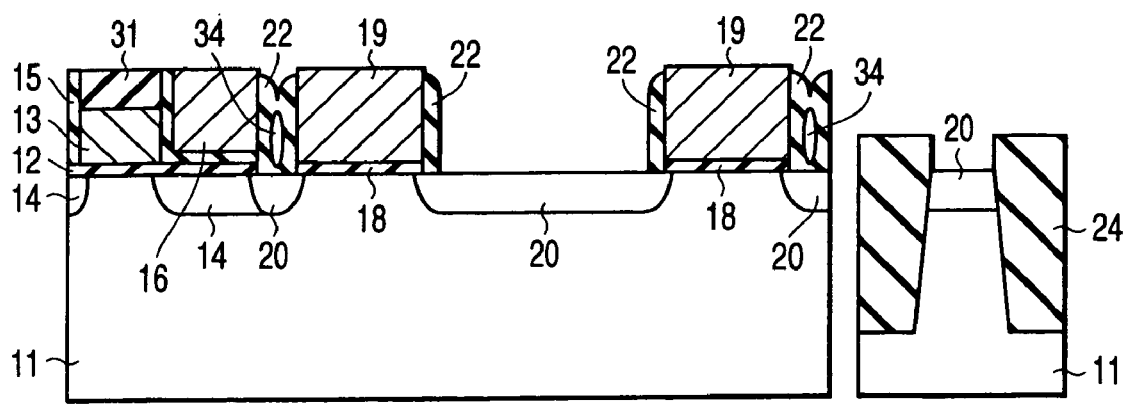
FIGS. 22A and 22B are cross-sectional views showing a step subsequent to FIGS. 21A and 21B.

Subsequently, as shown in FIGS. 22A and 22B, after the whole surface of the resist layer 33 is removed, the insulation material for forming the spacer is deposited on the whole surface. At this time, the space between the selection gate 19 and the adjacent control gate 16 is filled with the insulation material. Thereafter, the insulation material is etched by the RIE, and the spacers 22 are formed on the sidewalls of the selection gate 19 and in the space between the selection gate 19 and the adjacent control gate 16. Depending on conditions, the air gap 34 is formed inside the spacer 22 buried in the space between the selection gate 19 and the adjacent control gate 16.

Figures 23A, 23B:
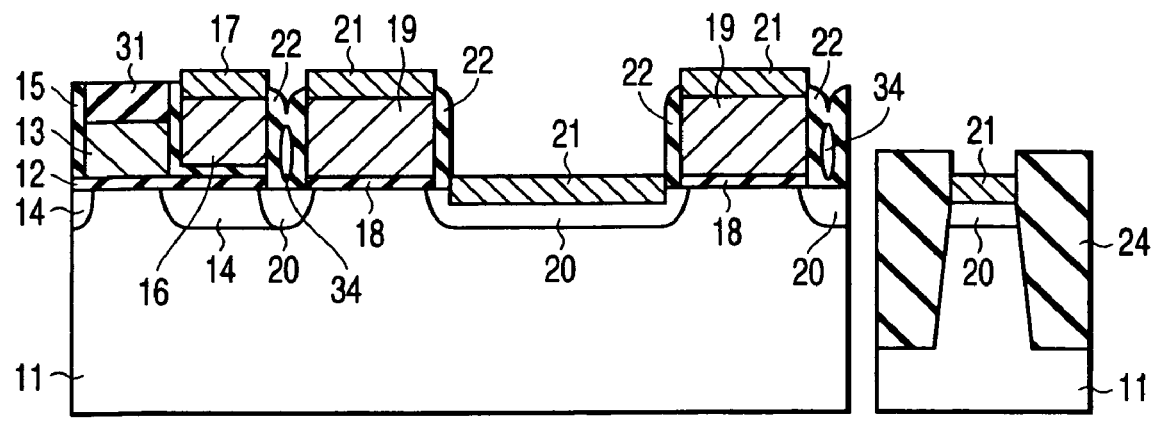
FIGS. 23A and 23B are cross-sectional views showing a step subsequent to FIGS. 22A and 22B.

Furthermore, as shown in FIGS. 23A and 23B, a metal thin film is deposited on the whole surface and thereafter heated, and the mask layer 31 is used as the control film of the salicide reaction. Accordingly, the metal salicide layer 17 is formed on the control gate 16, and the metal salicide layers 21 are formed on the selection gate 19 and on the exposed surface of the diffusion layer 20. The non-reacted metal thin film is thereafter removed.

Thereafter, the interlayer insulation film is deposited on the whole surface, further the contact hole is made in the interlayer insulation film positioned between the pair of selection gates 19, and the contact electrically connected to the metal salicide layer 21 is formed.

It is to be noted that the diffusion layer 20 constituting the source/drain region (S/D) of the selection transistor may have the LDD structure in the same manner as in the first embodiment.

Even in this case, examples of the metal material applied to the salicide structure include titanium, cobalt, and nickel. When the control gate 16 and the selection gate 19 are formed of the metal materials, for example, the stacked film of any one or at least two of titanium, tungsten, tungsten nitride, and titanium nitride are applicable.

Third Embodiment

Figure 24:
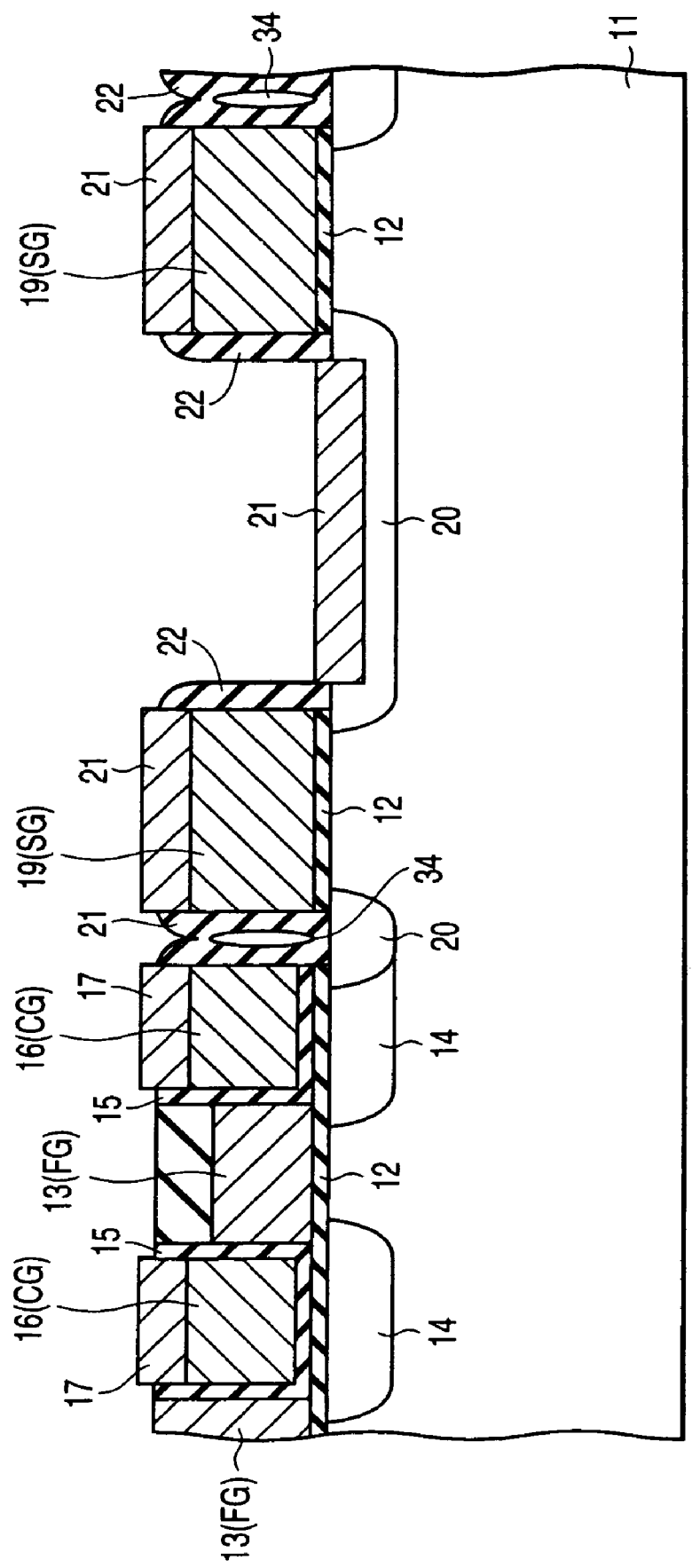
FIG. 24 is a cross-sectional view showing a constitution of a part of the cell array in the nonvolatile semiconductor memory device according to a third embodiment.

FIG. 24 shows a constitution of a part of the cell array in a nonvolatile semiconductor memory device according to a third embodiment, and corresponds to cross-sectional views of FIGS. 6, 20 in the first, second embodiments. It is to be noted that in FIG. 24, portions corresponding to those of FIG. 20 are denoted with the same reference numerals, and the description is omitted.

In the cell arrays according to the first and second embodiments, the gate insulation film 18 is different from the gate insulation film 12.

On the other hand, the same film as the gate insulation film 12 under the floating gate 13 is used as the gate insulation film under the selection gate 19 in the third embodiment.

In the present embodiment, the diffusion layers 20 which is the source or drain region of the selection transistor is different from the diffusion layer 14 of the cell transistor. Therefore, the ion dose amount during the forming of the diffusion layer 20 can be adjusted independently of the diffusion layer 14 of the cell transistor, and the characteristics of the selection transistor, such as the cut-off characteristics at the write/read time, can be set independently without being influenced by the cell transistor.

It is to be noted that FIG. 24 shows a case where the space between the selection gate 19 and the adjacent control gate 16 is filled with the spacer 22 and the diffusion layer 20 is not exposed in the same manner as in FIG. 20. However the space is not completely filled with the spacer 22, and the diffusion layer 20 of this portion may also be exposed in the same manner as in FIG. 6. In this case, the metal salicide layer 21 is formed on the surface of the diffusion layer 20 of this portion.

Figures 25A, 25B:
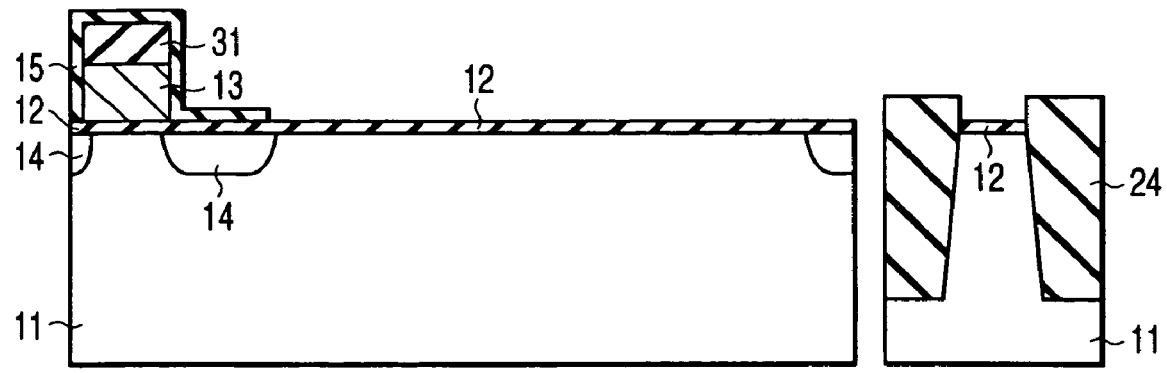
FIGS. 25A and 25B are cross-sectional views showing a mid step of a method of manufacturing the nonvolatile semiconductor memory device according to the third embodiment.

Next, a method of manufacturing the nonvolatile semiconductor memory device according to the third embodiment will be described. The steps of FIGS. 10A and 10B to 14A and 14B are similar to those of the first embodiment. In the first embodiment, thereafter the gate insulation film 12 and the inter-gate insulation films 15 in and around the region scheduled to form the selection gate are removed, and the gate insulation film 18 formed of silicon oxide is newly formed in the removed region. In this method, as shown in FIGS. 25A and 25B, only the inter-gate insulation films 15 in and around the region scheduled to form the selection gate are removed, and the gate insulation film 12 is left as such.

Figures 26A, 26B:
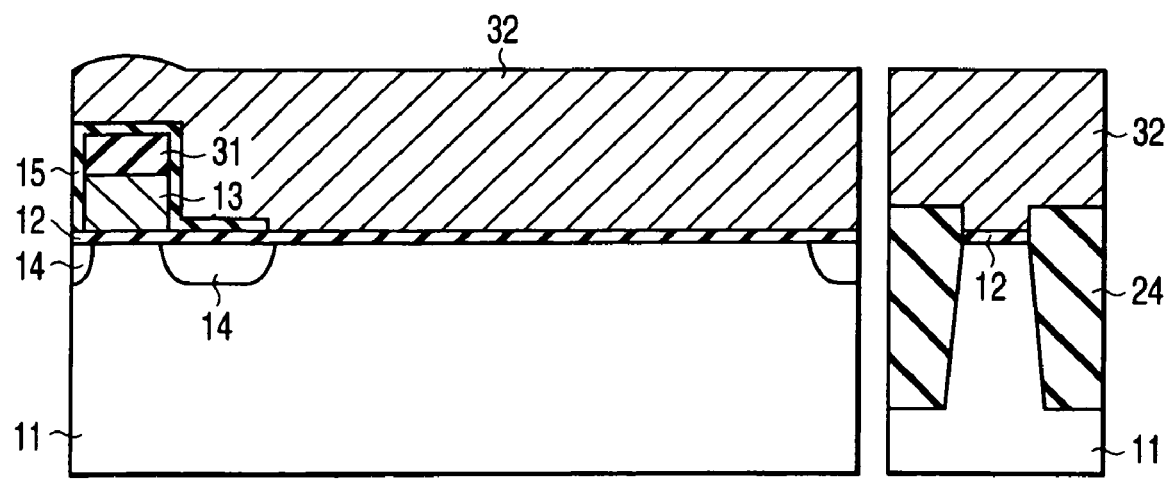
FIGS. 26A and 26B are cross-sectional views showing a step subsequent to FIGS. 25A and 25B.
Figures 27A, 27B:
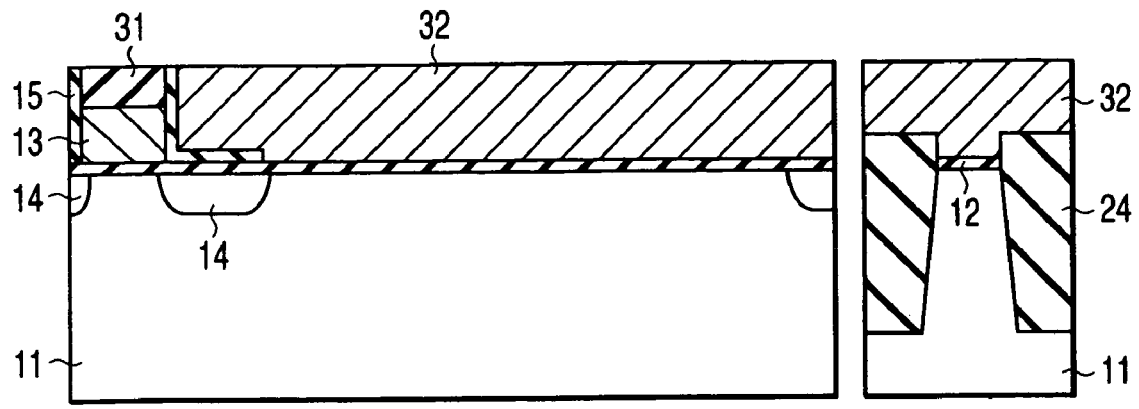
FIGS. 27A and 27B are cross-sectional views showing a step subsequent to FIGS. 26A and 26B.

Thereafter, as shown in FIGS. 26A and 26B, for example, the polysilicon layer 32 constituting the control gate and the selection gate is formed on the whole surface by the CVD. Next, as shown in FIGS. 27A and 27B, the polysilicon layer 32 is polished down to the mask layer 31 on the floating gate 13 by the CMP step, and flatted.

Figures 28A, 28B:
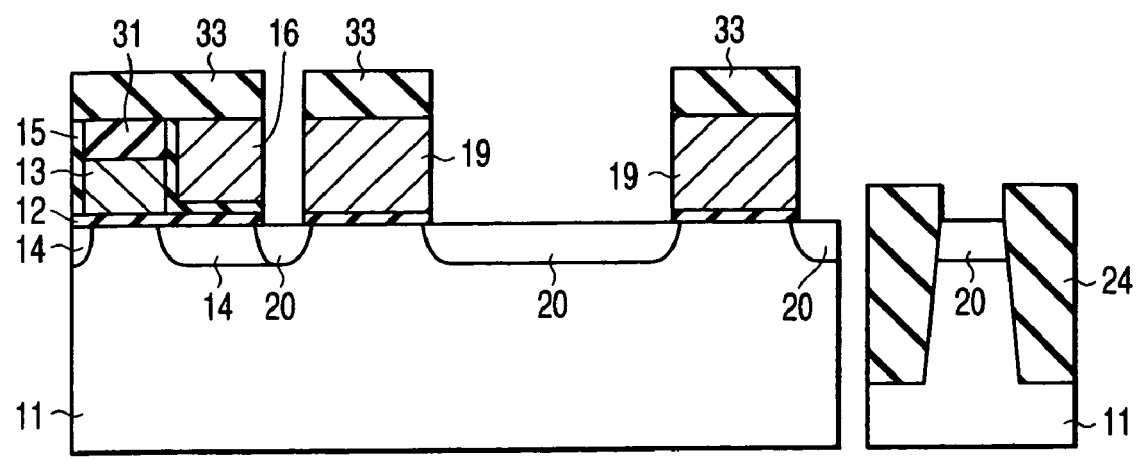
FIGS. 28A and 28B are cross-sectional views showing a step subsequent to FIGS. 27A and 27B.

Next, as shown in FIGS. 28A and 28B, the resist layer 33 is deposited on the whole surface, the lithography and selective etching steps are performed, and the polysilicon layer 32 and the gate insulation film 12 are etched using the patterned resist layer 33 as the mask. As a result, the control gate 16 and the selection gate 19 are formed. Subsequently, the impurity ions are injected into the substrate 11 using the selection gate 19 and the adjacent control gate 16 as the masks, and the diffusion layer 20 is formed to constitute the source/drain region (S/D) of the selection transistor. The dose amount and the acceleration energy of ions during the ion injection are adjusted in such a manner that the desired characteristics of the selection transistor are obtained.

Figures 29A, 29B:
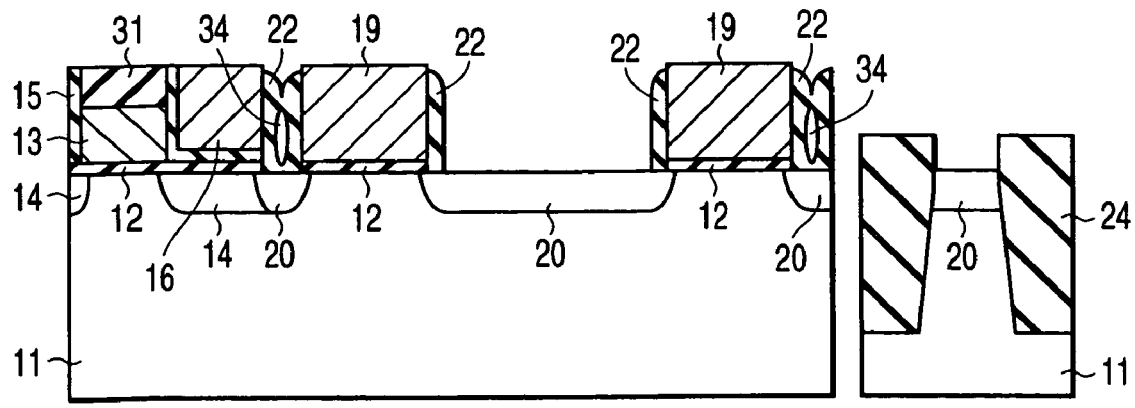
FIGS. 29A and 29B are cross-sectional views showing a step subsequent to FIGS. 28A and 28B.

Subsequently, as shown in FIGS. 29A and 29B, after the resist layer 33 is removed from the whole surface, the insulation material for forming the spacer is deposited on the whole surface. Thereafter, the insulation material is etched by the RIE, and the spacers 22 are formed on the sidewalls of the selection gate 19 and on the sidewall of the control gate 16 adjacent to the selection gate 19. In this case, since the space between the selection gate 19 and the adjacent control gate 16 is small, the space is filled with the spacer 22, and the diffusion layer 20 in this portion is not exposed. It is to be noted that after the spacers 22 are formed, the impurity ions are injected again, and the diffusion layer 20 constituting the source/drain region (S/D) of the selection transistor may be formed in the LDD structure. The air gap 34 is formed in the spacer 22 buried in the space between the selection gate 19 and the adjacent control gate 16.

Figures 30A, 30B:
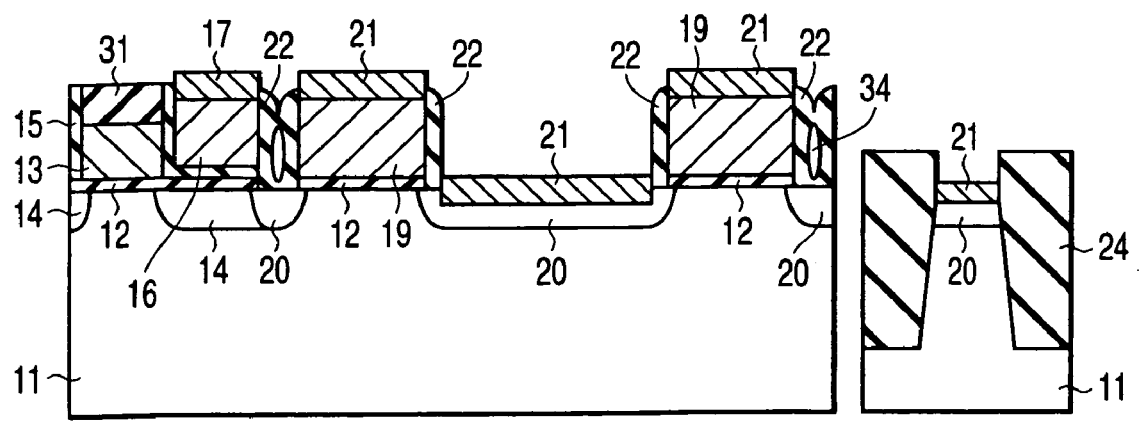
FIGS. 30A and 30B are cross-sectional views showing a step subsequent to FIGS. 29A and 29B.

Next, as shown in FIGS. 30A and 30B, the metal thin film is deposited on the whole surface and thereafter heated, and the mask layer 31 is used as the control film of the salicide reaction. Accordingly, the metal salicide layer 17 is formed on the control gate 16, and the metal salicide layers 21 are formed on the selection gate 19 and on the exposed surface of the diffusion layer 20. The non-reacted metal thin film is thereafter removed.

Thereafter, the interlayer insulation film is deposited on the whole surface, further the contact hole is made in the interlayer insulation film positioned between the pair of selection gates 19, and the contact electrically connected to the metal salicide layer 21 is formed.

Even in this case, the examples of the metal material applied to the salicide structure include titanium, cobalt, and nickel. When the control gate 16 and the selection gate 19 are formed of the metal materials, for example, the stacked film of any one or at least two of titanium, tungsten, tungsten nitride, and titanium nitride are applicable.

Fourth Embodiment

Next, a nonvolatile semiconductor memory device according to a fourth embodiment will be described.

In the nonvolatile semiconductor memory devices according to the first to third embodiments, the control gate of the cell transistor and the selection gate of the selection transistor are constituted using a conductive material (polysilicon layer) of the same layer, and the floating gate of the cell transistor is constituted using the conductive material (polysilicon layer) of the layer different from that of the conductive material.

On the other hand, in the nonvolatile semiconductor memory device according to the fourth embodiment, the floating gate of the cell transistor and the selection gate of the selection transistor are constituted using the conductive material of the same layer, and the control gate of the cell transistor is constituted using the conductive material of the layer different from that of the floating gate and the selection gate.

Figure 31:
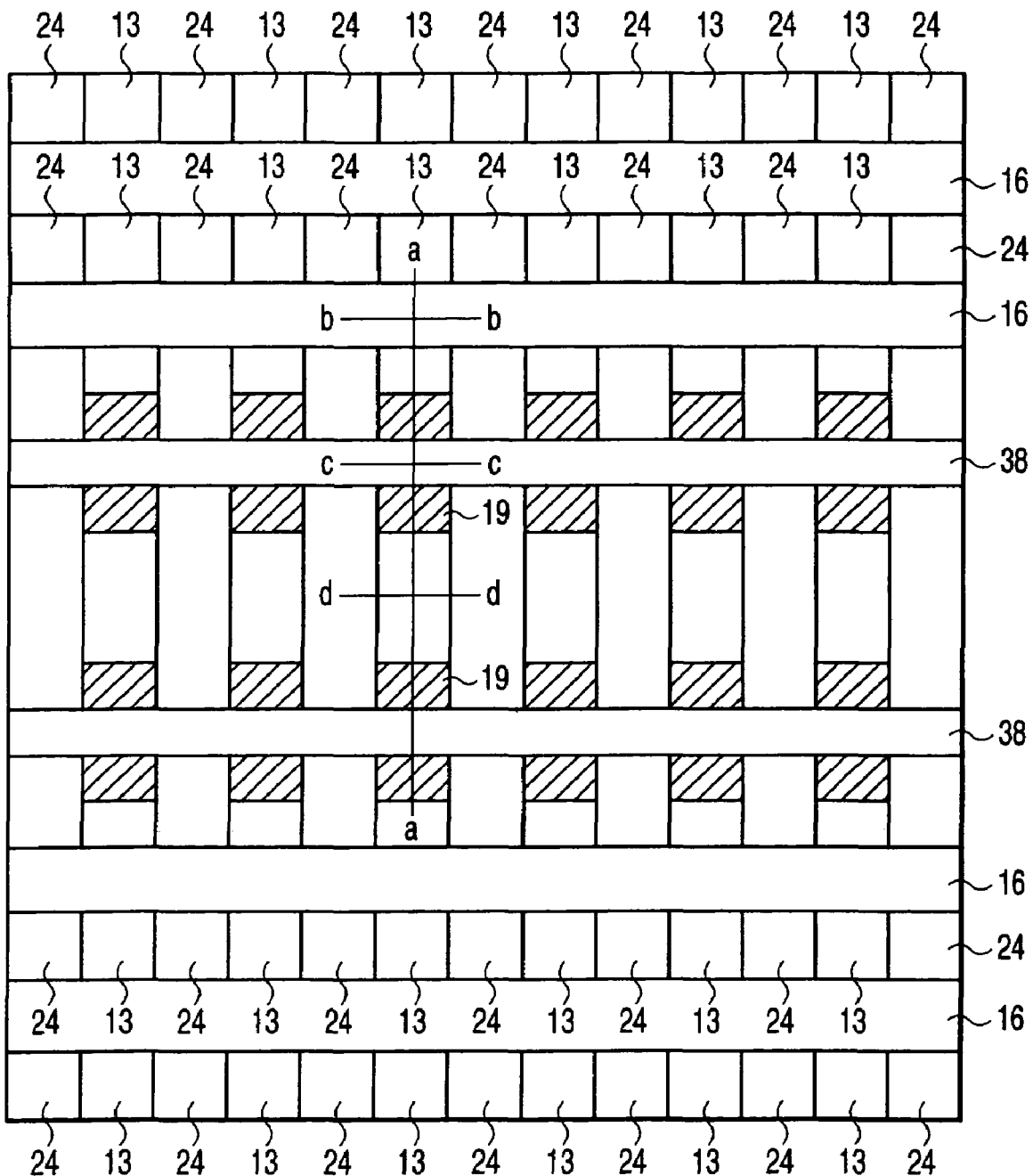
FIG. 31 is a pattern plan view of the nonvolatile semiconductor memory device according to a fourth embodiment.
Figures 32A, 32B, 32C, 32D:
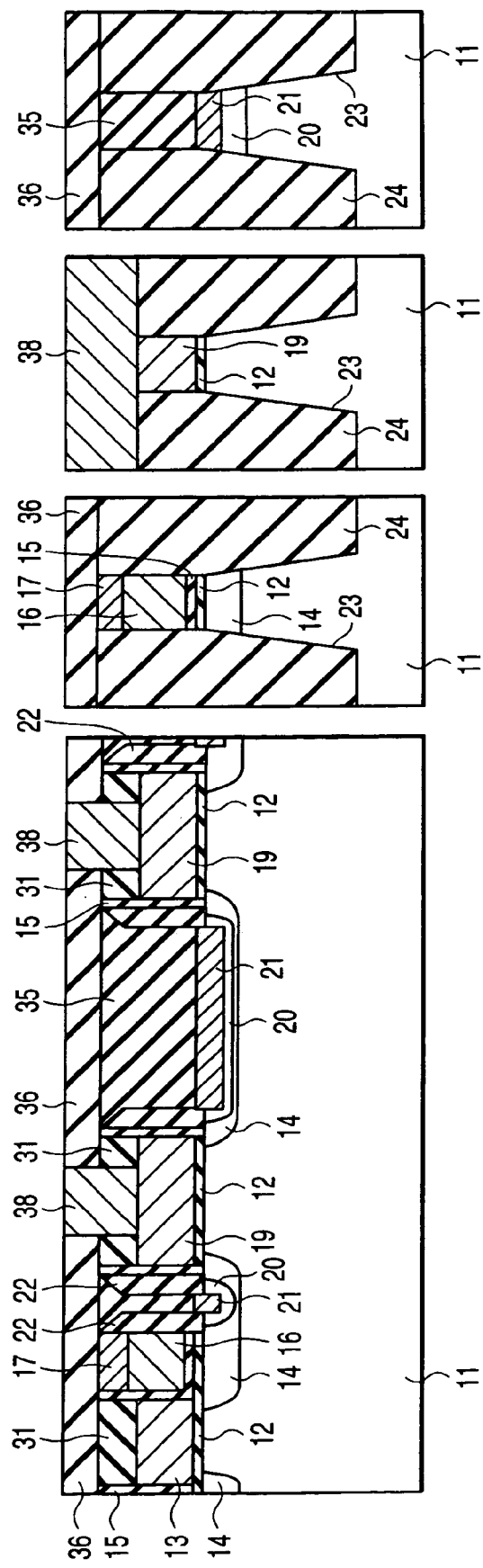
FIGS. 32A to 32D are cross-sectional views showing a different section of FIG. 31.
Figures 34A, 34B, 34C, 34D:
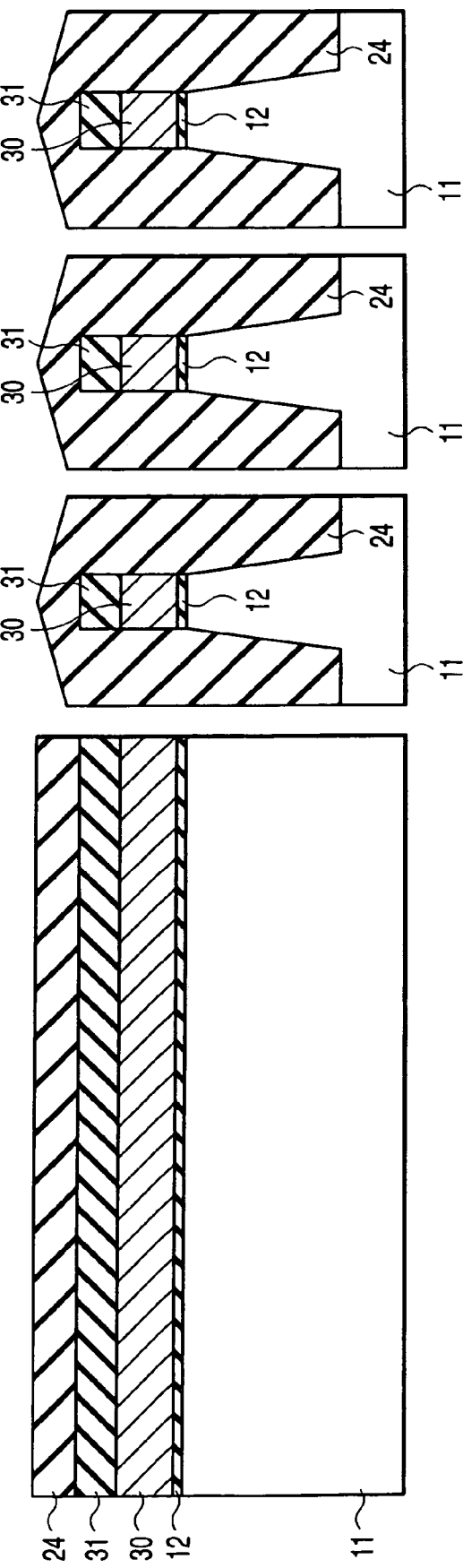
FIGS. 34A to 34D are cross-sectional views showing a step subsequent to FIGS. 33A to 33D.
Figure 35D:
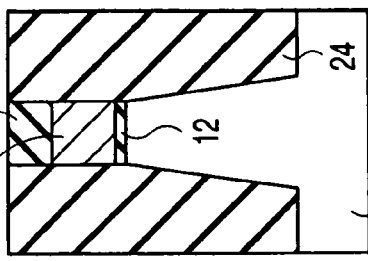
FIGS. 35A to 35D are cross-sectional views showing a step subsequent to FIGS. 34A to 34D.
Figure 35C:
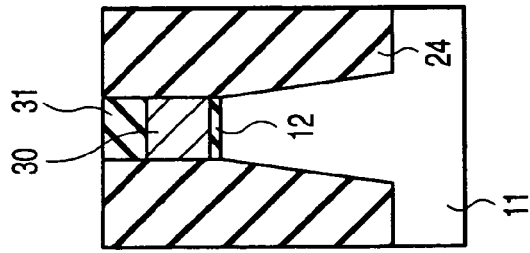
Figure 35B:
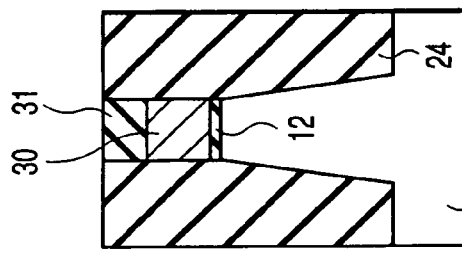
Figure 35A:
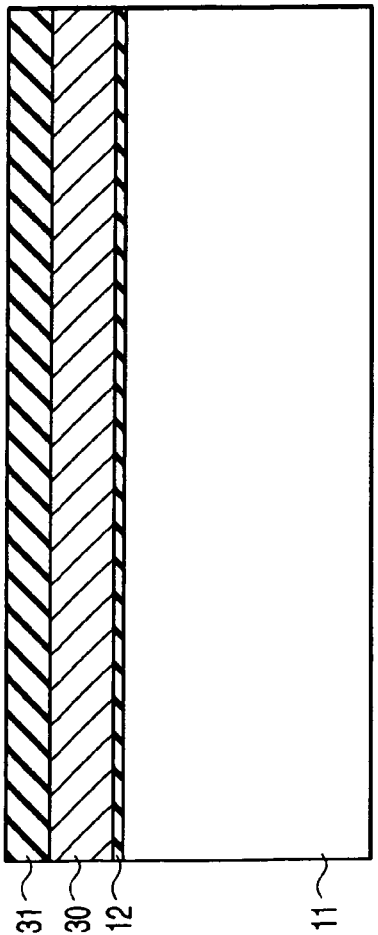
Figures 38A, 38B, 38C, 38D:
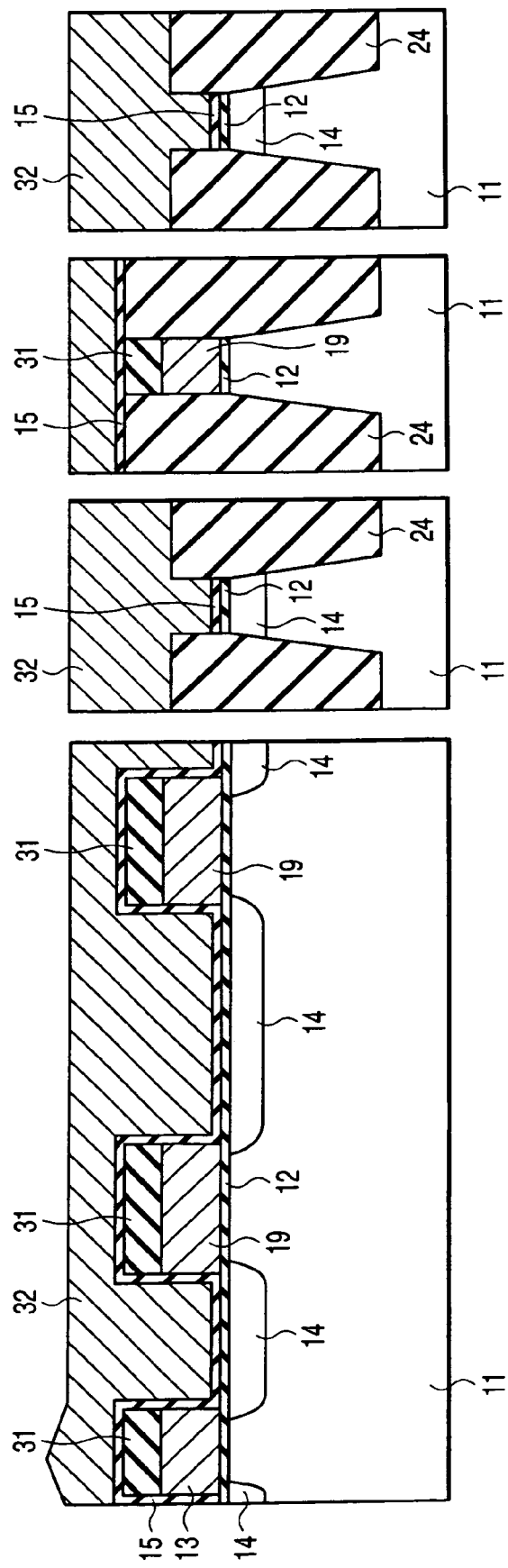
FIGS. 38A to 38D are cross-sectional views showing a step subsequent to FIGS. 37A to 37D.
Figures 39A, 39B, 39C, 39D:
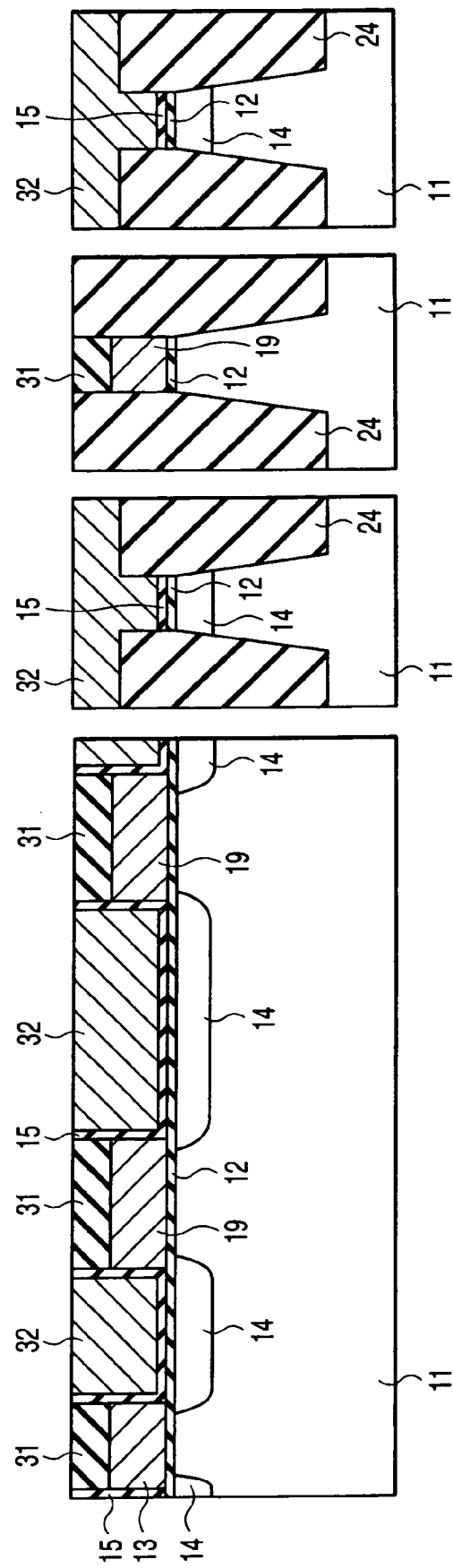
FIGS. 39A to 39D are cross-sectional views showing a step subsequent to FIGS. 38A to 38D.
Figures 41A, 41B, 41C, 41D:
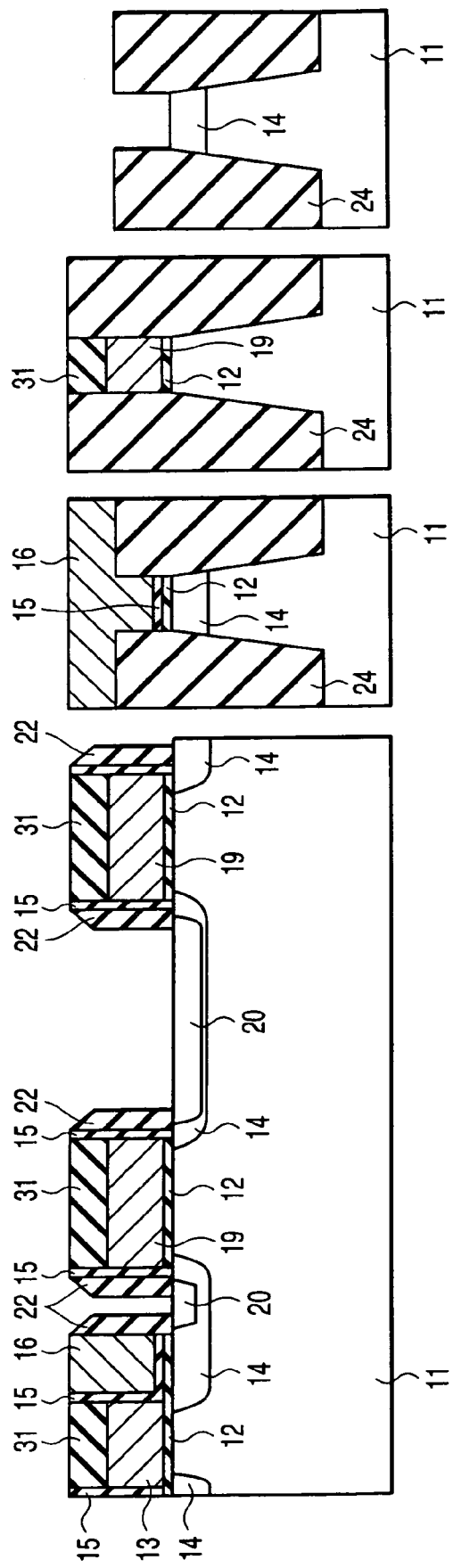
FIGS. 41A to 41D are cross-sectional views showing a step subsequent to FIGS. 40A to 40D.
Figures 42A, 42B, 42C, 42D:
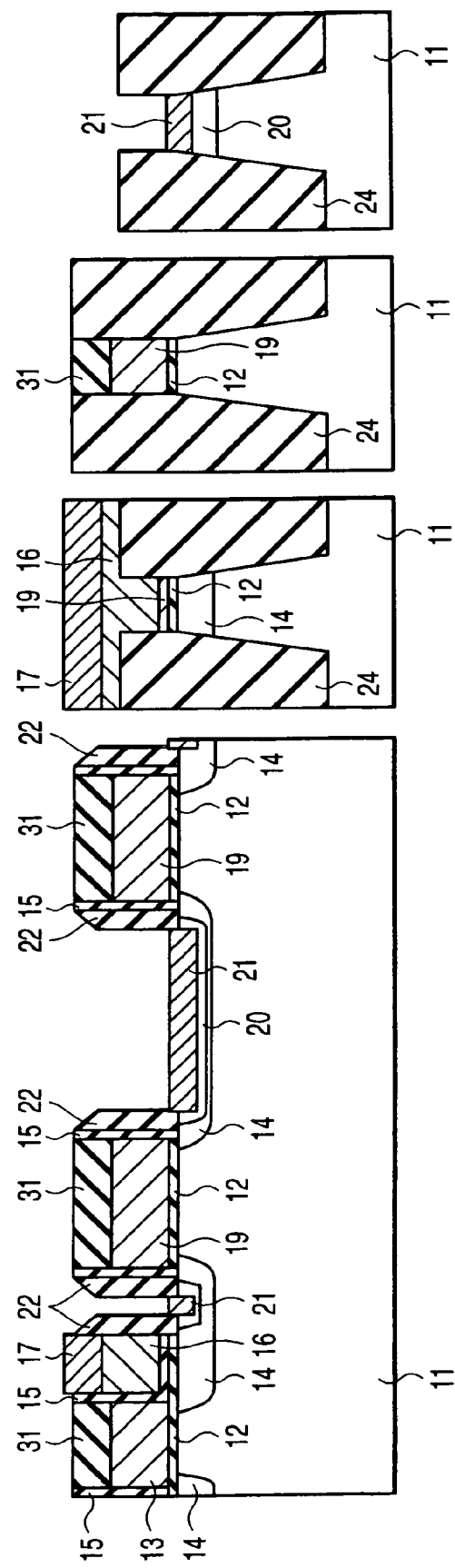
FIGS. 42A to 42D are cross-sectional views showing a step subsequent to FIGS. 41A to 41D.
Figures 43A, 43B, 43C, 43D:
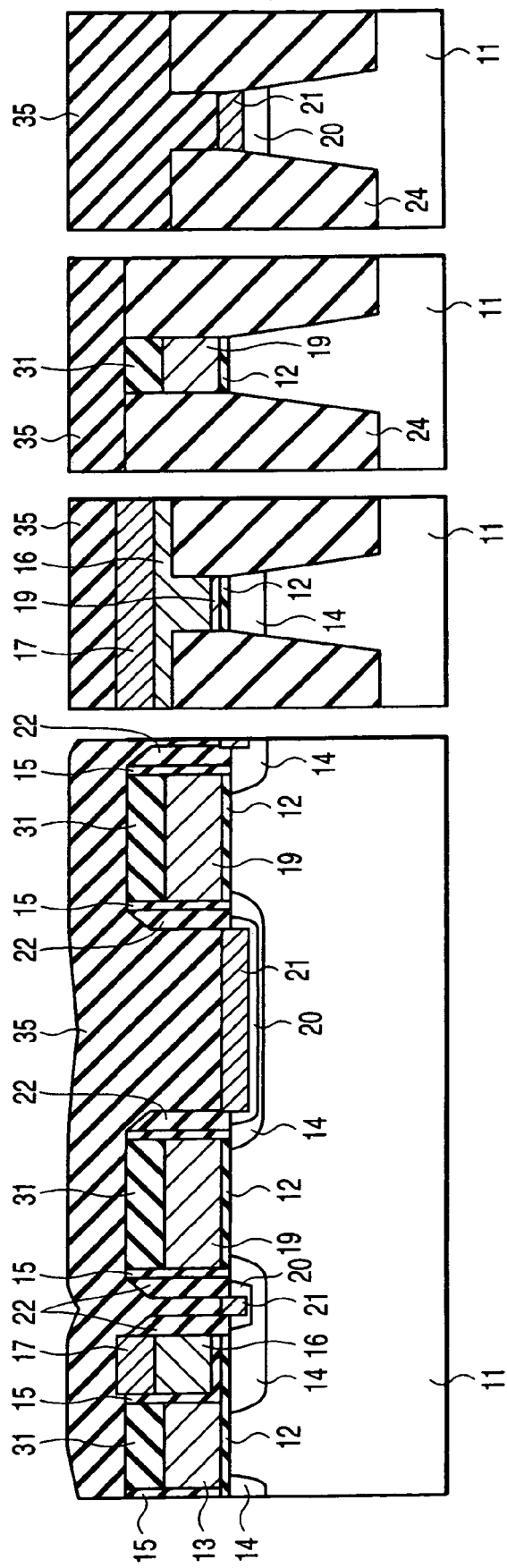
FIGS. 43A to 43D are cross-sectional views showing a step subsequent to FIGS. 42A to 42D.

FIG. 31 is a pattern plan view of the nonvolatile semiconductor memory device according to the fourth embodiment. A plurality of memory cells is connected in series to the selection transistor to constitute a memory cell array. A plurality of memory cell arrays is arranged in a matrix form. FIGS. 32A to 32D are cross-sectional views along lines a-a, b-b, c-c, d-d in FIG. 31.

The nonvolatile semiconductor memory device according to the embodiment comprises: a cell transistor including a floating gate 13 which is formed on a semiconductor substrate 11 via a gate insulation film 12 and on which a mask layer 31 is formed, a pair of diffusion layers 14 which are source or drain regions positioned on the opposite sides of the floating gate 13 and formed in the substrate 11, a pair of control gates 16 which are formed on the opposite sides of the floating gate 13 and which drive the floating gate 13, and inter-gate insulation films 15 formed between the pair of control gates 16 and the floating gate 13; a selection transistor for selecting the cell transistor, including a selection gate 19 which is formed on the substrate 11 via the gate insulation film 12 and on which the mask layer 31 is formed, and a pair of diffusion layers 20 constituting source or drain regions which are formed in the substrate 11 positioned on the opposite sides of the selection gate 19 and one of which is connected to the diffusion layer 14 of the cell transistor; and a wiring 38 which is extended in a lateral direction (line direction) in FIG. 31 to connect the selection gates 19 of a plurality of memory cell arrays to one another. As shown in FIGS. 32A to 32D, the respective memory cell arrays are mutually isolated by the insulation film 24 for isolating devices, buried in the trench 23.

A method of manufacturing the nonvolatile semiconductor memory device according to the fourth embodiment will be described hereinafter with reference to FIGS. 33A to 33D to 45A to 45D. It is to be noted that each figure A corresponds to a cross-sectional view of line a-a in FIG. 31, each figure B corresponds to a cross-sectional view of line b-b in FIG. 31, each figure C corresponds to a cross-sectional view of line c-c in FIG. 31, and each figure D corresponds to a cross-sectional view of line d-d in FIG. 31.

First, as shown in FIGS. 33A to 33D, the gate insulation film 12 formed, for example, of silicon oxide is formed on the silicon semiconductor substrate 11. For example, a polysilicon layer 30 and a mask layer 31 are successively formed on the gate insulation film 12 to constitute the floating gate. For example, a silicon oxide film or a silicon nitride film is applied to the mask layer 31. The mask layer 31 has a minimum condition that a selectivity to the polysilicon layer 30 is obtained in etching the polysilicon layer 30. However, it is more preferable that a selectivity to the insulation film for the burying be obtained in the CMP step during the forming of STI described later and that a selectivity to the control gate be obtained in the CMP step during the forming of the control gate. Thereafter, the mask layer 31 is patterned by the lithography step and the selective etching step. The polysilicon layer 30, gate insulation film 12, and substrate 11 are successively etched using the patterned mask layer 31 to form the shallow trench 23 for isolating the devices.

Next, as shown in FIGS. 34A to 34D, an insulation film 24 formed, for example, of a silicon oxide film is formed on the whole surface, for example, by the CVD to fill in the trench 23 formed in the substrate 11. Subsequently, as shown in FIGS. 35A to 35D, the insulation film 24 is polished down to the mask layer 31 by the CMP step using the mask layer 31 as a stopper, and the STI is formed.

Next, the lithography and selective etching steps are performed to etch the polysilicon layer 30. In this case, as shown in FIGS. 36A to 36D, the mask layer 31 is patterned in such a manner that the mask layer 31 remains on a floating gate forming region of the cell transistor and a selection gate forming region of the selection transistor. Thereafter, the polysilicon layer 30 is etched, and the floating gate 13 and selection gate 19 are formed by the same polysilicon layer 30. Thereafter, in a state in which the mask layer 31 is left, the impurity ions are injected into the substrate 11, and the diffusion layers 14 are formed to constitute the source/drain region (S/D) of the cell transistor. At this time, the diffusion layer 14 is also formed in a portion constituting the source/drain region (S/D) of the selection transistor.

Subsequently, as shown in FIGS. 37A to 37D, the inter-gate insulation film 15 is formed on the whole surface. The inter-gate insulation film 15 is formed, for example, by a stacked film of any one or at least two of silicon oxide, silicon nitride, aluminum oxide, hafnium oxide, and zirconium oxide. As an example, the ONO film may be used.

Thereafter, as shown in FIGS. 38A to 38D, for example, a polysilicon layer 32 constituting the control gate is formed on the whole surface by the CVD. Next, as shown in FIGS. 39A to 39D, the polysilicon layer 32 is polished down to the mask layer 31 on the floating gate 13 by the CMP step, and flatted.

Next, as shown in FIGS. 40A to 40D, the lithography and selective etching steps are performed to etch the polysilicon layer 32, inter-gate insulation film 15, and gate insulation film 12 in order to leave the polysilicon layer 32, inter-gate insulation film 15, and gate insulation film 12 in the control gate forming region. As a result, the control gate 16 is formed.

Subsequently, as shown in FIGS. 41A to 41D, the insulation material for forming the spacer is deposited on the whole surface, the insulation material is thereafter etched by the RIE, and the spacers 22 are formed on the sidewalls of the selection gate 19 and on the sidewall of the control gate 16 adjacent to the selection gate 19. In this case, since a space between the selection gate 19 and the adjacent control gate 16 is sufficiently large, the space is not completely filled with the spacer 22, and the diffusion layer 14 is exposed in this portion. Subsequently, the impurity ions are injected into the substrate 11 again, and the diffusion layers 20 are formed on the surface of the diffusion layer 14 positioned between the selection gate 19 and the adjacent control gate 16 and the surface of the diffusion layer 14 positioned between the pair of selection gates 19.

Next, as shown in FIGS. 42A to 42D, the metal thin film is deposited on the whole surface and thereafter heated, and the mask layer 31 is used as the control film of the silicide reaction. Accordingly, the metal salicide layer 17 is formed on the control gate 16, and the metal salicide layer 21 is formed on the surface of the diffusion layer 20. The non-reacted metal thin film is thereafter removed.

Subsequently, as shown in FIGS. 43A to 43D, a barrier film and an interlayer insulation film 35 formed, for example, of SiN are deposited on the whole surface. Next, as shown in FIGS. 44A to 44D, the interlayer insulation film 35 is polished down to the mask layer 31 on the floating gate 13 by the CMP step, and flatted.

Next, as shown in FIGS. 45A to 45D, after depositing an insulation film 36 on the whole surface, the lithography and selective etching steps are performed to form openings 37 in the insulation film 36. Subsequently, the mask layer 31 on the selection gate 19 is etched/removed via the opening 37.

Next, as shown in FIGS. 32A to 32D described above, a metal film for wiring is deposited on the whole surface, and thereafter the whole surface is polished by the CMP step, and flatted. Accordingly, a wiring 38 is formed to connect the selection gates 19 of different memory cell arrays to one another.

Thereafter, contact holes are opened with respect to the insulation film 36 and the interlayer insulation film 35 positioned between the pair of selection gates 19, and the contact electrically connected to the metal salicide layer 21 is formed.

In this manner, in the nonvolatile semiconductor memory device shown in FIGS. 31 and 32A to 32D, the floating gate 13 of the cell transistor and the selection gate 19 of the selection transistor are constituted using the conductive material of the same layer, and the control gate 16 of the cell transistor is constituted using the conductive material of the layer different from that of the floating gate 13 and the selection gate 19.

It is to be noted that in the fourth embodiment, the use of the gate insulation films 12 having an equal film thickness as the gate insulation films of the cell transistor and the selection transistor has been described, but the gate insulation films having different film thicknesses may also be used.

Moreover, a case where any air gap is not disposed in the spacer 22 positioned between the control gate 16 and the selection gate 19 has been described, but the air gap may also be disposed in the spacer 22 in the same manner as in FIG. 20.

Even in this case, the examples of the metal material applied to the salicide structure include titanium, cobalt, and nickel. When the control gate 16 and the selection gate 19 are the metal materials, for example, the stacked film of any one or at least two of titanium, tungsten, tungsten nitride, and titanium nitride are applicable.

Even in the fourth embodiment, when the film thickness of the floating gate 13 is increased without considering any increase of the parasitic capacitance, the capacitance ratio can be secured. As a result, even when the gate length or the channel width of the cell transistor is micronized, the capacitance ratio can be increased. Additionally, since the capacitance ratio can be increased, the write voltage can be reduced. Therefore, according to the fourth embodiment, the micronizing of the cell transistor and the reducing of the write voltage can be simultaneously satisfied.

Furthermore, the diffusion layer 20 which is the source or drain region of the selection transistor is different from the diffusion layer 14 of the cell transistor, and therefore the ion dose amount during the forming of the diffusion layer 20 can be adjusted independently of the diffusion layer 14 of the cell transistor. As a result, the characteristics of the selection transistor, such as the cut-off characteristics at the write/read time, can be set independently without being influenced by the cell transistor.

The diffusion layer 20 constituting the source/drain region of the selection transistor may also be formed in the LDD structure in the same manner as in the first embodiment.

Fifth Embodiment

Next, a nonvolatile semiconductor memory device according to a fifth embodiment will be described.

In the nonvolatile semiconductor memory device according to the fourth embodiment, the wiring 38 which mutually connects the selection gates 19 of the different memory cell arrays is constituted using a metal film. On the other hand, in the nonvolatile semiconductor memory device according to the fifth embodiment, the wiring which mutually connects the selection gates 19 of the different memory cell arrays is constituted using the conductive material of the same layer as that of the control gate of the cell transistor and the metal salicide film formed on the control gate.

Figure 46:
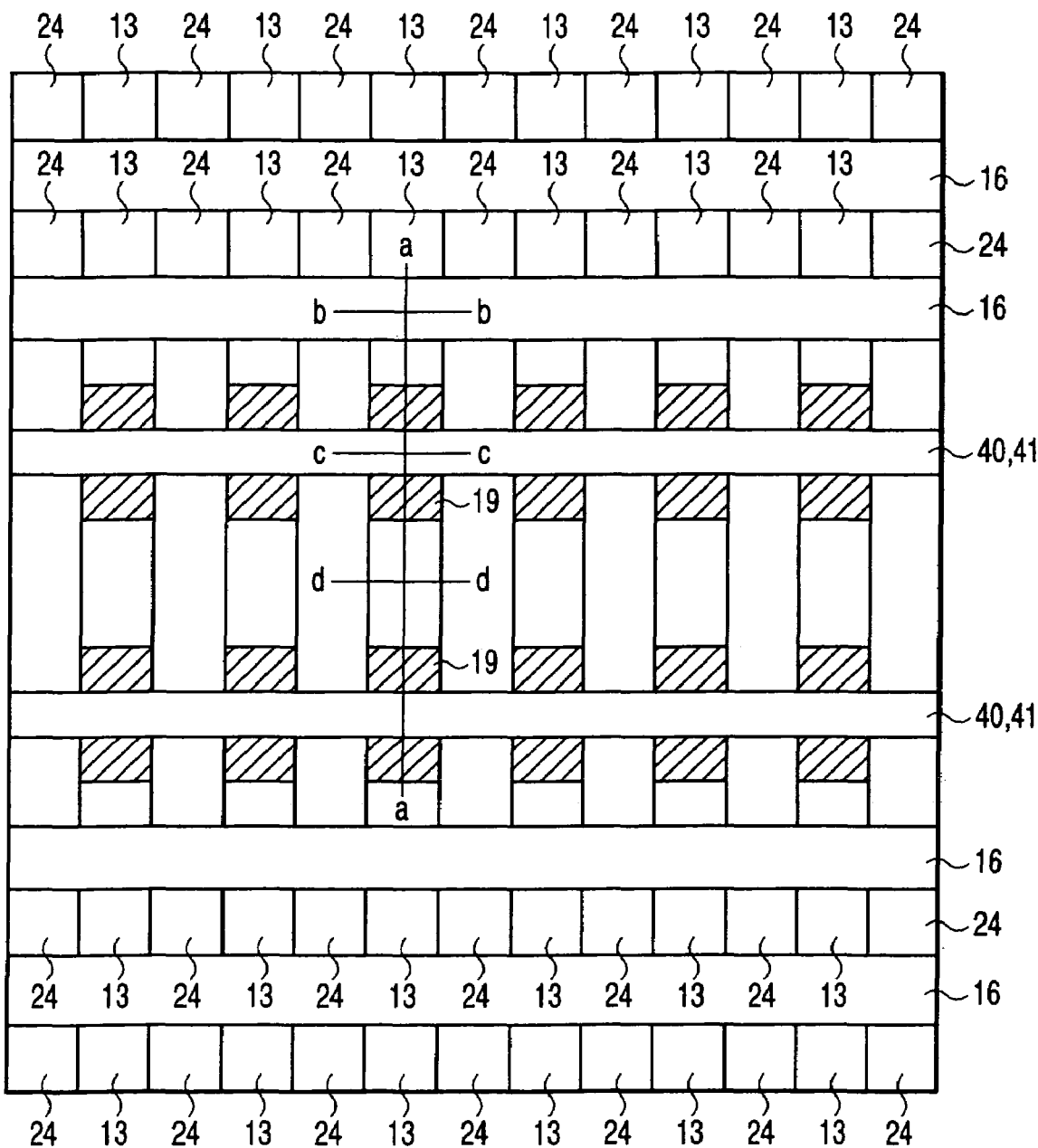
FIG. 46 is a pattern plan view of the nonvolatile semiconductor memory device according to a fifth embodiment.
Figures 47A, 47B, 47C, 47D:
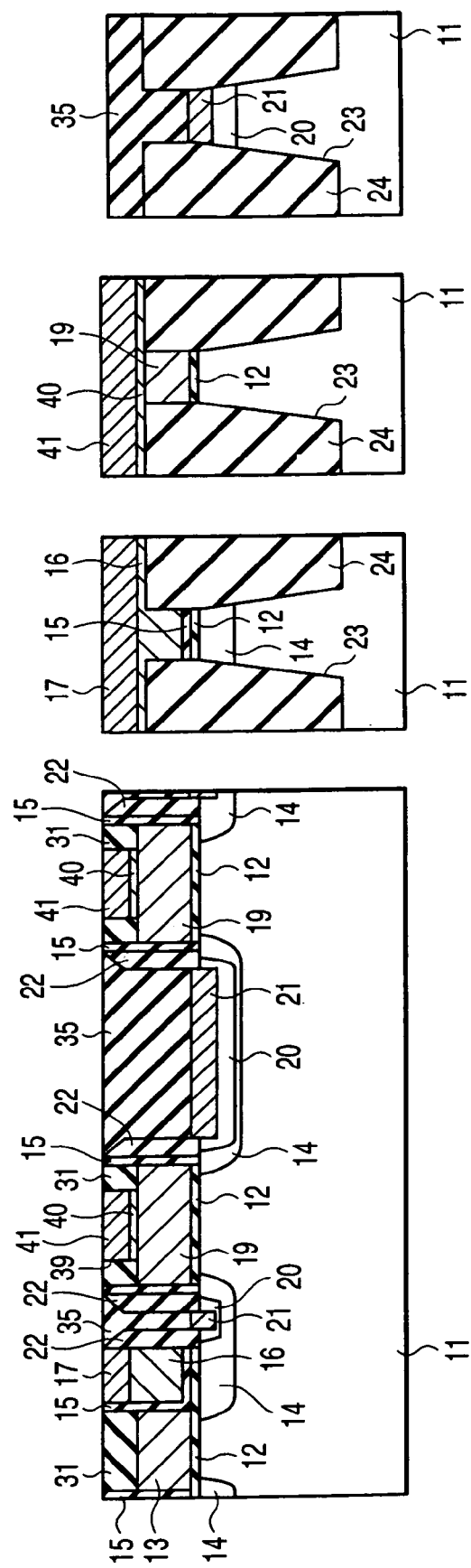
FIGS. 47A to 47D are cross-sectional views showing a different section of FIG. 46.
Figures 49A, 49B, 49C, 49D:
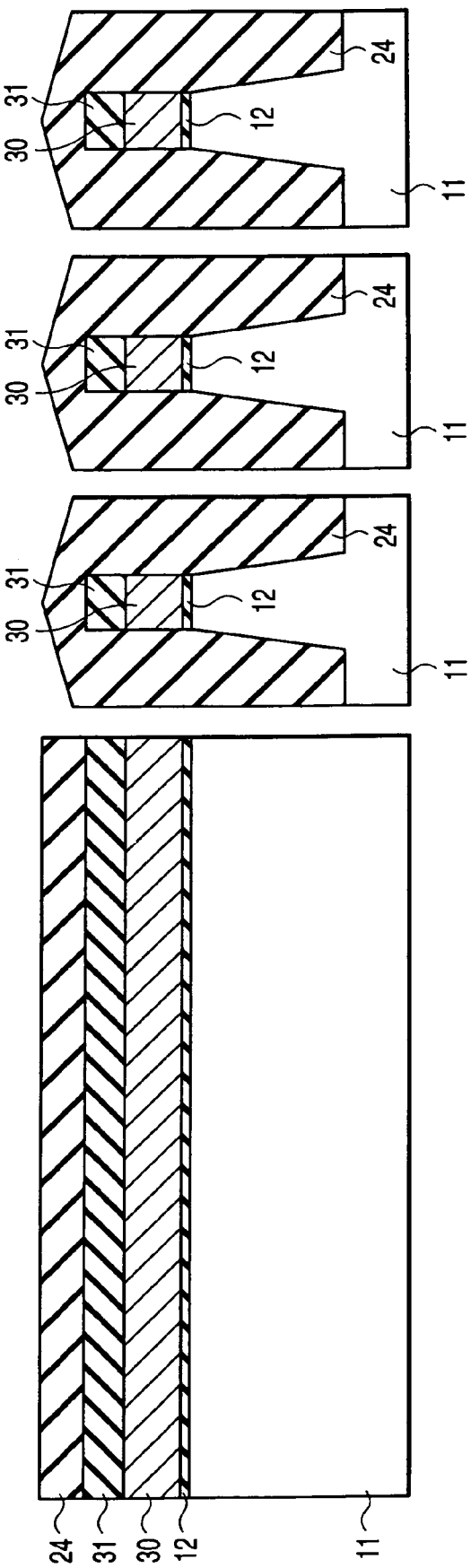
FIGS. 49A to 49D are cross-sectional views showing a step subsequent to FIGS. 48A to 48D.
Figures 58A, 58B, 58C, 58D:
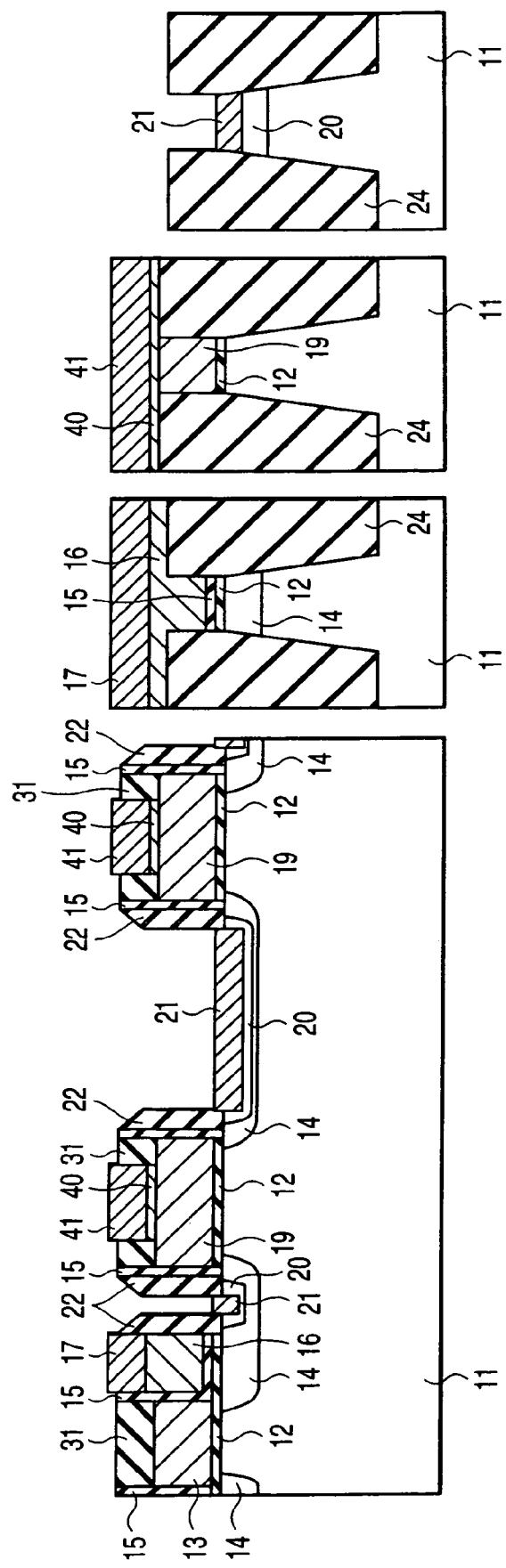
FIGS. 58A to 58D are cross-sectional views showing a step subsequent to FIGS. 57A to 57D.
Figures 59A, 59B, 59C, 59D:
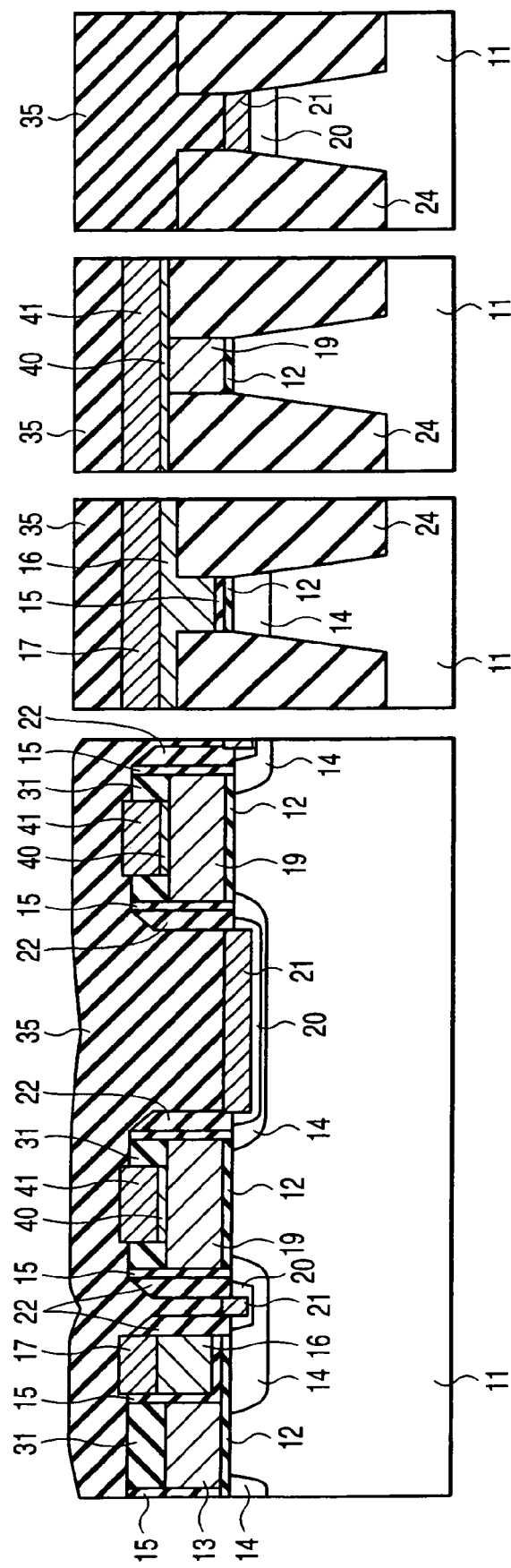
FIGS. 59A to 59D are cross-sectional views showing a step subsequent to FIGS. 58A to 58D.

FIG. 46 is a pattern plan view of the nonvolatile semiconductor memory device according to the fifth embodiment. A plurality of cell transistors is connected in series to the selection transistor to constitute a memory cell array. A plurality of memory cell arrays is arranged in a matrix form. FIGS. 47A to 47D are cross-sectional views along lines a-a, b-b, c-c, d-d in FIG. 46.

The nonvolatile semiconductor memory device according to the embodiment comprises: a cell transistor including a floating gate 13 which is formed on a semiconductor substrate 11 via a gate insulation film 12 and on which a mask layer 31 is formed, a pair of diffusion layers 14 which are source or drain regions positioned on the opposite sides of the floating gate 13 and formed in the substrate 11, control gates 16 which are formed on the opposite sides of the floating gate 13 and which drive the floating gate 13, and inter-gate insulation films 15 formed between the control gates 16 and the floating gate 13; a selection transistor for selecting the cell transistor, including a selection gate 19 which is formed on the substrate 11 via the gate insulation film 12 and on which the mask layer 31 is formed, and a pair of diffusion layers 20 constituting source or drain regions which are formed in the substrate 11 positioned on the opposite sides of the selection gate 19 and one of which is connected to the diffusion layer 14 of the cell transistor; an opening 39 formed in the mask layer 31 on the selection gate; a wiring 40 which fills in the opening 39 and which is electrically connected to the selection gate 19 and which is extended in a direction in a direction intersecting with an arrangement direction of the cell transistors and the selection transistor and which is constituted using the same conductive material as that of the first or second control gate; and a metal salicide layer 41 formed on the wiring 40. As shown in FIGS. 47A to 47D, the respective memory cell arrays are isolated from one another by the insulation film 24 for isolating devices, buried in the trench 23.

A method of manufacturing the nonvolatile semiconductor memory device according to the fifth embodiment will be described hereinafter with reference to FIGS. 48A to 48D to 59A to 59D. It is to be noted that each figure A corresponds to a cross-sectional view of line a-a in FIG. 46, each figure B corresponds to a cross-sectional view of line b-b in FIG. 46, each figure C corresponds to a cross-sectional view of line c-c in FIG. 46, and each figure D corresponds to a cross-sectional view of line d-d in FIG. 46.

First, as shown in FIGS. 48A to 48D, the gate insulation film 12 formed, for example, of silicon oxide is formed on the silicon semiconductor substrate 11. For example, a polysilicon layer 30 and a mask layer 31 are successively formed on the gate insulation film 12 to constitute the floating gate. For example, a silicon oxide film or a silicon nitride film is applied to the mask layer 31. The mask layer 31 has a minimum condition that a selectivity to the polysilicon layer 30 is obtained in etching the polysilicon layer 30. However, it is more preferable that a selectivity to the insulation film for the burying be obtained in the CMP step during the forming of the STI and that a selectivity to the control gate be obtained in the CMP step during the forming of the control gate. Thereafter, the mask layer 31 is patterned by the lithography step and the selective etching step. The polysilicon layer 30, gate insulation film 12, and substrate 11 are successively etched using the patterned mask layer 31 to form the shallow trench 23 for isolating the devices.

Next, as shown in FIGS. 49A to 49D, an insulation film 24 formed, for example, of a silicon oxide film is formed on the whole surface, for example, by the CVD to fill in the trench 23 formed in the substrate 11. Subsequently, as shown in FIGS. 50A to 50D, the insulation film 24 is polished down to the mask layer 31 by the CMP step using the mask layer 31 as a stopper, and the STI is formed.

Next, the lithography and selective etching steps are performed to etch the polysilicon layer 30. In this case, as shown in FIGS. 51A to 51D, the mask layer 31 is patterned in such a manner that the mask layer 31 remains on a floating gate forming region of the cell transistor and a selection gate forming region of the selection transistor. Thereafter, the polysilicon layer 30 is etched, and the floating gate 13 and selection gate 19 are formed by the same polysilicon layer 30. Thereafter, in a state in which the mask layer 31 is left, the impurity ions are injected into the substrate 11, and the diffusion layers 14 are formed to constitute the source/drain region (S/D) of the cell transistor. At this time, the diffusion layer 14 is also formed in a portion constituting the source/drain region (S/D) of the selection transistor.

Subsequently, as shown in FIGS. 52A to 52D, the inter-gate insulation film 15 is formed on the whole surface. The inter-gate insulation film 15 is formed, for example, by a stacked film of any one or at least two of silicon oxide, silicon nitride, aluminum oxide, hafnium oxide, and zirconium oxide. As an example, the ONO film may be used.

Next, as shown in FIGS. 53A to 53D, the lithography and selective etching steps are performed, a part of the mask layer 31 on the selection gate 19 is removed, and an opening 39 having a depth reaching the selection gate 19 is formed.

Thereafter, as shown in FIGS. 54A to 54D, for example, a polysilicon layer 32 constituting the wiring on the control gate and the selection gate is formed on the whole surface by the CVD.

Next, as shown in FIGS. 55A to 55D, the polysilicon layer 32 is polished down to the mask layer 31 on the floating gate 13 by the CMP step, and flatted. By this step, the wiring 40 is formed in the opening 39.

Next, as shown in FIGS. 56A to 56D, the lithography and selective etching steps are performed, and the polysilicon layer 32, inter-gate insulation film 15, and gate insulation film 12 are etched in such a manner that the polysilicon layer 32, the inter-gate insulation film 15 disposed under the polysilicon layer, and the gate insulation film 12 in the control gate forming region are left. As a result, the control gate 16 is formed.

Subsequently, as shown in FIGS. 57A to 57D, the insulation material for forming the spacer is deposited on the whole surface. Thereafter, the insulation material is etched by the RIE, and the spacers 22 are formed on the sidewalls of the selection gate 19 and on the sidewall of the control gate 16 adjacent to the selection gate 19. In this case, since a space between the selection gate 19 and the adjacent control gate 16 is sufficiently large, the space is not completely filled with the spacer 22, and the diffusion layer 14 is exposed in this portion. Subsequently, the impurity ions are injected into the substrate 11 again, and the diffusion layers 20 are formed on the surface of the diffusion layer 14 positioned between the selection gate 19 and the adjacent control gate 16 and the surface of the diffusion layer 14 positioned between the pair of selection gates 19.

Next, as shown in FIGS. 58A to 58D, the metal thin film is deposited on the whole surface and thereafter heated, and the mask layer 31 is used as the control film of the silicide reaction. Accordingly, the metal salicide layer 17 is formed on the control gate 16, and the metal salicide layer 21 is formed on the surface of the diffusion layer 20. A metal salicide layer 41 is also formed on the wiring 40 on the selection gate 19. The non-reacted metal thin film is thereafter removed.

Subsequently, as shown in FIGS. 59A to 59D, a barrier film made of, for example, SiN and an interlayer insulation film 35 are deposited on the whole surface. Next, as shown in FIGS. 47A to 47D, the interlayer insulation film 35 is polished down to the mask layer 31 on the floating gate 13 by the CMP step, and flatted.

Thereafter, a contact hole is made with respect to the interlayer insulation film 35 positioned between the pair of selection gates 19, and a contact electrically connected to the metal salicide layer 21 is formed.

In this manner, in the nonvolatile semiconductor memory device shown in FIGS. 46 and 47A to 47D, the floating gate 13 of the cell transistor and the selection gate 19 of the selection transistor are constituted using the same conductive material, and the control gate 16 of the cell transistor is constituted using the conductive materials different from those of the floating gate 13 and selection gate 19.

It is to be noted that in the fifth embodiment, the use of the gate insulation films 12 having the equal film thickness as the gate insulation films of the cell transistor and the selecting transistor has been described, but the gate insulation films having different film thicknesses may also be used.

Moreover, the case where any air gap is not disposed in the spacer 22 positioned between the control gate 16 and the selection gate 19 has been described, but the air gap may also be disposed in the spacer 22 in the same manner as in FIG. 20.

Furthermore, the case where a part of the mask layer 31 on the selection gate 19 is removed and the opening 39 having a depth reaching the selection gate 19 is formed when forming the wiring 40 connecting a plurality of selection gates 19 to one another has been described. However, in a state in which all the mask layers 31 on the selection gates 19 are removed and all the upper portions of the selection gates 19 are exposed, the wiring 40 made of the polysilicon layer may also be formed.

Even in this case, the examples of the metal material applied to the salicide structure include titanium, cobalt, and nickel. When the control gate 16 and the selection gate 19 are formed of the metal materials, for example, the stacked film of any one or at least two of titanium, tungsten, tungsten nitride, and titanium nitride are applicable.

Even in the fifth embodiment, when the film thickness of the floating gate 13 is increased without considering any increase of the parasitic capacitance, the capacitance ratio can be secured. As a result, even when the gate length or the channel width of the cell transistor is micronized, the capacitance ratio can be increased. Additionally, since the capacitance ratio can be increased, the write voltage can be reduced. Therefore, according to the fifth embodiment, the micronizing of the cell transistor and the reducing of the write voltage can be simultaneously satisfied.

Furthermore, the diffusion layer 20 which is the source or drain region of the selection transistor is different from the diffusion layer 14 of the cell transistor, and therefore the ion dose amount during the forming of the diffusion layer 20 can be adjusted independently of the diffusion layer 14 on the cell transistor. As a result, the characteristics of the selection transistor, such as the cut-off characteristics at the write/read time, can be set independently without being influenced by the cell transistor.

It is to be noted that the diffusion layer 20 constituting the source/drain region (S/D) of the selection transistor may also be formed in the LDD structure in the same manner as in the first embodiment.

Next, an operation of the nonvolatile semiconductor memory device according to the first to fifth embodiments will be described.

Figure 60:
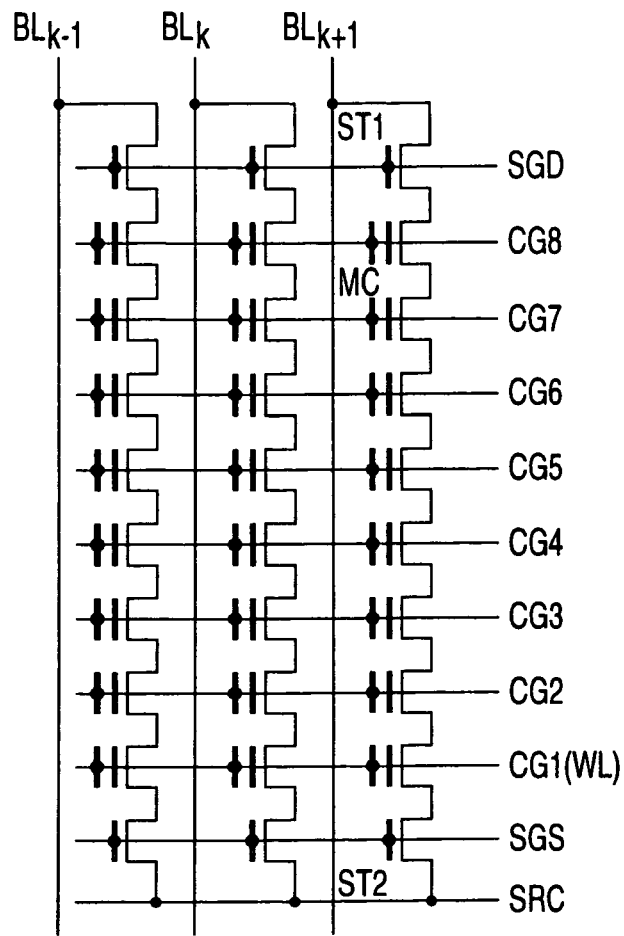
FIG. 60 is a circuit diagram showing a known NAND type EEPROM.
Figure 61:
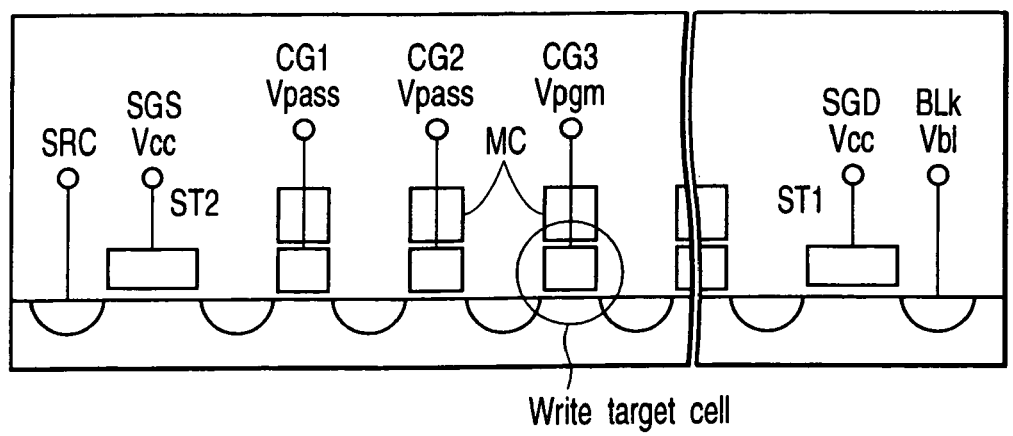
FIG. 61 is a diagram showing an example of a potential in a case where data is written in a memory cell shown in FIG. 60.

First, a known NAND type EEPROM will be described with reference to FIGS. 60, 61. FIG. 60 shows a circuit constitution of the NAND type EEPROM, and FIG. 61 shows an example of a potential in a case where data is written in the cell transistor in this NAND type EEPROM. In FIGS. 60 and 61, the same components are denoted with the same reference numerals.

The NAND type EEPROM is constitutes by connecting a cell transistor including a plurality of adjacent memory cells MC and sources/drains of selection gates ST1, ST2 in series. The selection gate ST1 is connected to a bit line BL, and the selection gate ST2 is connected to a source line SL.

A predetermined gate potential Vsg is applied to a selection gate line SGD on the side of the bit line BL at a data write time. A sufficiently low potential Vb1 is supplied to the bit line BL. The gate potential Vsg is set to a potential at which the selection gate ST1 can be sufficiently turned on with respect to Vb1. When the potential Vb1 is supplied to the bit line, the selection gate ST1 is turned on, and the potential Vb1 is transmitted to the cell transistor. Therefore, a channel potential of the cell transistor sufficiently drops, and the data is written.

In the EEPROM, at the data write time, capacitance coupling between the control gate and the floating gate is used in either an operation for applying a write potential Vpgm to a selected word line WL (CG3 in FIG. 61) to write data into the cell or an operation for applying a transfer potential Vpass to a non-selected word line WL (except CG3 in FIG. 61) to form a channel.

Figure 62:
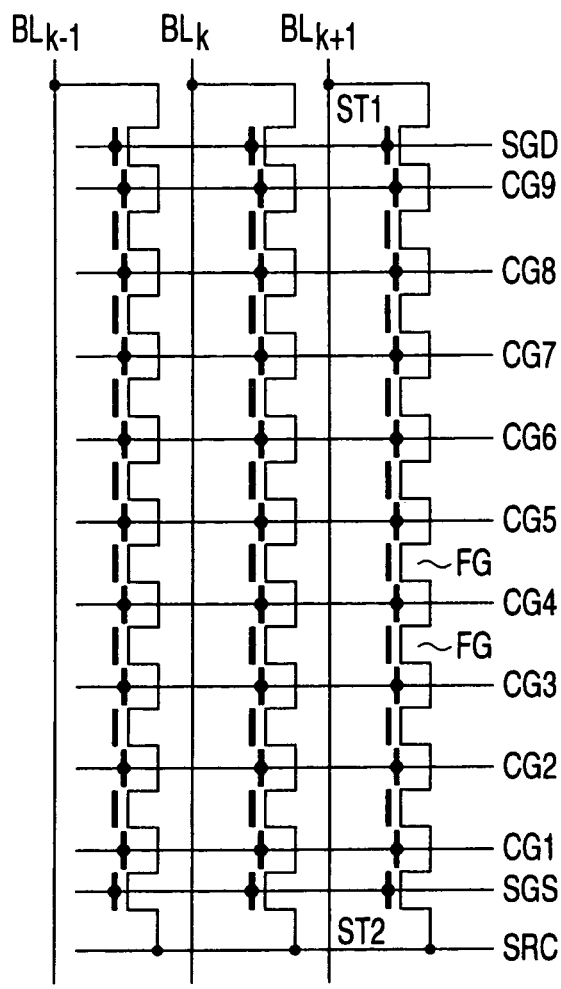
FIG. 62 is a circuit diagram showing a constitution of the nonvolatile semiconductor memory device according to the first to fifth embodiments.
Figure 63:
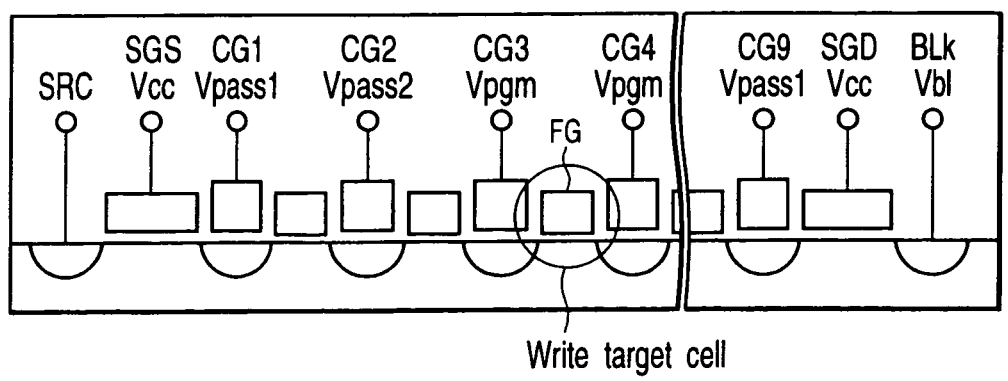
FIG. 63 is a diagram showing an example of a potential applied to each part in a case where the data is written, together with a schematic section of the circuit of FIG. 62.

FIG. 62 shows a circuit constitution of the nonvolatile semiconductor memory device according to the first to fifth embodiments, and FIG. 63 shows an example of a potential applied to each part in a case where the data is written, together with a schematic section of the circuit.

As described above, two control gates CG are disposed on the opposite sides of the floating gate FG as described above, and the floating gate FG is selected by two control gates CG. That is, the floating gate FG is driven by the capacitance coupling with two control gates CG.

Figure 64:
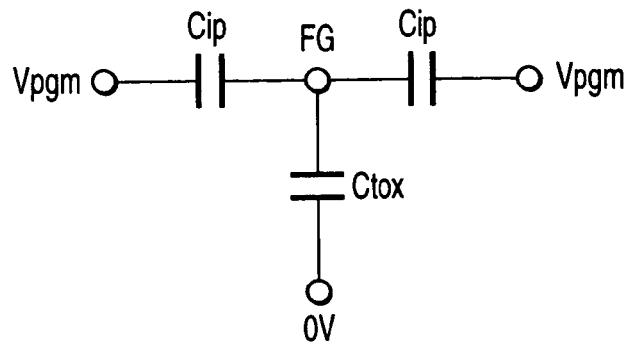
FIG. 64 is an equivalent circuit diagram showing an example of potential setting in a case where the data is written in the cell shown in FIG. 62.

For example, at the write time, the equal write potential Vpgm is applied to two control gates CG positioned on the opposite sides of the floating gate FG of the write target cell in which the data is written, and the substrate (P-type substrate) is set, for example, to 0 V. This equivalent circuit of the write target cell is shown in FIG. 64. In this state, charges are injected into the floating gate FG from the substrate. In this case, as described in the first to fifth embodiments, the capacitance ratio can be increased regardless of the micronizing of the device, and the potential Vpgm can be reduced as compared with the prior art.

It is to be noted that the potentials applied to each control gate CG and selection gates SGD, SGS are generated by a row decoder circuit which is a control gate driving circuit.

In the write operation, a case where the equal voltage is supplied to two control gates CG to drive the floating gate FG has been described. However, different potentials may also be supplied to two control gates CG.

Figure 65:
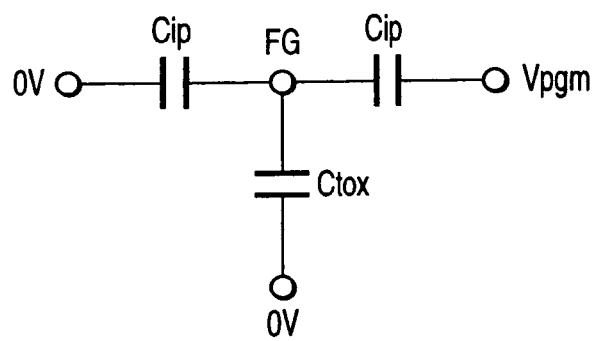
FIG. 65 is an equivalent circuit diagram showing another example of the potential setting in a case where the data is written in the cell shown in FIG. 62.

FIG. 65 shows the equivalent circuit of the write target cell in a case where the potential Vpgm is supplied to one control gate CG, and 0 V is supplied to the other control gate CG. In FIG. 65, it is assumed that a capacitance ratio of Cip to Ctox is 1.5:1 and any charge is not injected into the floating gate FG in a neutral threshold voltage and the existing threshold voltage is 0 V.

The potential Vfg of the floating gate FG shown in FIG. 64 is as follows:

$$Vfg = Vpgm \times 2 \times Cip / (2 \times Cip + Ctox)$$
$$= 0.75 \times Vpgm$$

On the other hand, the potential Vfg of the floating gate FG shown in FIG. 65 is as follows:

$$Vfg = Vpgm \times Cip / (2 \times Cip + Ctox)$$
$$= 0.375 \times Vpgm$$

In this manner, when the potential of one of two control gates CG is changed, the capacitance ratio can be largely controlled.

Figure 66:
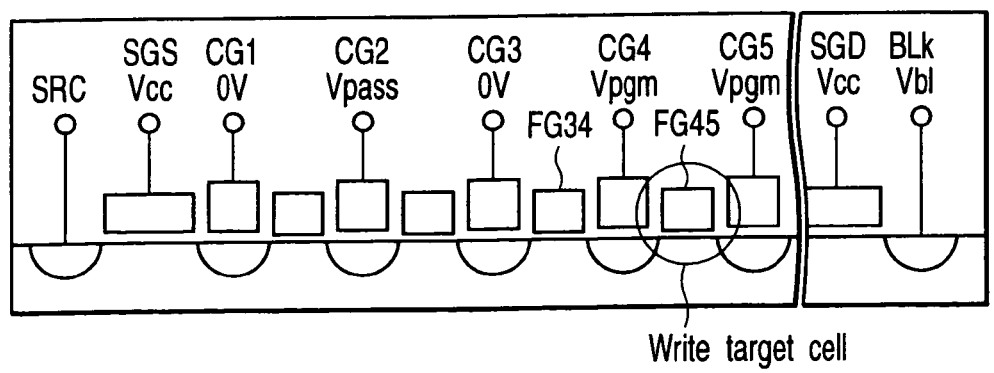
FIG. 66 is a diagram showing an example of writing of the data using the potential setting shown in FIG. 65.

FIG. 66 shows an example of the writing of the data using the above-described characteristics. In FIG. 66, the potentials Vpgm are applied to the control gates CG on the opposite sides of the write target cell. By the use of the above-described assumption, a potential of 0.75×Vpgm is applied to the floating gate FG of the write target cell. While 0 V is applied to one of two control gates CG positioned on the left side of the write target cell, and the potential Vpgm is applied to the other control gate. Therefore, a potential of 0.375×Vpgm is applied to the floating gate FG of the cell positioned on the left side of the write target cell. Therefore, an electric field stress to the adjacent cell is ½ of the floating gate FG of the selected cell, which is sufficient for suppressing any write error. The potential is transferred to the control gate CG2 remote from the selected cell, or a predetermined potential Vpass for boosting the channel potential is applied. At an actual device operation time, the potentials of the control gates CG are appropriately combined in consideration of write characteristics, channel boosting characteristics, potential transfer characteristics and the like.

FIG. 67 shows a cross-sectional view of the nonvolatile semiconductor memory device according to the first to fifth embodiments, and shows an example of the potential applied to each part in a case where the data is erased.

When the data is erased, the substrate (P-type substrate) on which the cell transistors are arranged is boosted to an erase potential Vera. Moreover, the diffusion layer connected to the bit line BL and source line SL and the selection gates SGS, SGD are boosted to the potential Vera equal to that of the substrate in order to prevent collapse. Furthermore, a sufficiently low potential, for example, 0 V is supplied to the control gate CG positioned adjacent to the cell to be erased. Then, the charges are pulled toward the boosted substrate from the floating gate FG, and the data is erased.

It is to be noted that the control gate CG is floating in a non-erased cell. In this case, the potential of the control gate CG is boosted to the substrate potential by the capacitance coupling with the substrate, and the data is inhibited from being erased.

In this manner, even in the cell transistor having the structure in which the control gates CG are disposed on the opposite sides of the floating gate FG, the data can be securely erased.

FIG. 68 shows a cross-sectional view of the nonvolatile semiconductor memory device according to the first to fifth embodiments, and shows an example of the potential applied to each part in a case where the data is read.

In FIG. 68, read voltages Vw1 are supplied to two control gates CG (CG4, CG5) adjacent to the floating gate FG (FG45) of a read target cell. The read voltage Vw1 is preferably set to an appropriate potential in consideration of the write characteristics, data retention characteristics, an operation range of a cell transistor threshold voltage and the like. Assuming that a read voltage Vw1=0 V is set, a potential of 0 V is applied to the floating gate FG of the read target cell.

On the other hand, a potential Vread for passing a cell current is applied to the control gate CG further adjacent to two control gates CG positioned on the opposite sides of the read target cell. The potential Vread is preferably set to an appropriate potential in order to eliminate the influence of the non-selected cell connected to the read target cell and to judge the threshold voltage of the read target cell.

The bit line BL is connected to a sense amplifier circuit having a latch function, and the threshold voltage of the read target cell is judged in the sense amplifier circuit to sense the data at the read time. Here, at the read time, the threshold voltage is judged with respect to only the cell in which both two control gates CG disposed on the opposite sides of the cell indicate a read voltage Vw1, and the cell in which the potentials of two control gates CG indicate a combination different from the above-described combination is brought into an on-state regardless of the stored data.

FIG. 69 shows a cross-sectional view of the nonvolatile semiconductor memory device according to the first to fifth embodiments, and shows another example of the potential applied to each part in a case where the data is read.

In this example, read voltages Vw1 are supplied to two control gates CG (CG4, CG5) positioned on the opposite sides of the floating gate FG (FG45) of the read target cell. A potential Vread2 for passing the cell current is applied to the other control gate CG (CG1, CG2, etc.).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents. For example, a case where a plurality of memory cells are connected in series, and connected to the NAND type has been described with reference to FIG. 62, but a plurality of memory cell transistors may also be connected to an AND type.

What is claimed is:

1. A method of manufacturing a nonvolatile semiconductor memory device comprising:

sequentially depositing a first gate insulation film and a first conductive layer on a semiconductor substrate;

forming a floating gate of a memory cell by patterning the first conductive layer;

forming source and drain regions of the memory cell in the semiconductor substrate;

depositing an inter-gate insulation film on the entire surface of the resultant structure;

exposing the semiconductor substrate by removing the inter-gate insulation film and the first gate insulation film in and around a region in which to form a selection gate of a selection transistor for selecting the memory cell;

forming a second gate insulation film on the exposed surface of the semiconductor substrate;

forming first and second control gates of the memory cell which are arranged on both sides of the floating gate with the inter-gate insulation film interposed and a selection gate, by patterning a second conductive layer after depositing and flattening the second conductive layer on the entire surface of the resultant structure; and forming source and drain regions of the selection transistor in the semiconductor substrate so that one of the source and drain regions is integral with one of the source and drain regions of the memory cell.

2. The method according to claim 1, further comprising:

forming a trench in the semiconductor substrate by selectively etching the first conductive layer and the first gate insulation film before forming the floating gate; and forming an STI by depositing a first insulation film into the trench.

3. The method according to claim 1, wherein a film thickness of the first gate insulation film is different from that of the second gate insulation film.

4. The method according to claim 1, wherein a film thickness of the first gate insulation film is equal to that of the second gate insulation film.

5. The method according to claim 1, further comprising:
forming metal salicide layers on each of the selection gate and the source and drain regions of the selection transistor.

6. The method according to claim 1, further comprising:
forming a second insulation film between one of the first and second control gates and the selection gate.

7. The method according to claim 6, wherein the second insulation film comprises one of a single layer of an insulation film and a plurality of layers of insulation films.

8. The method according to claim 6, wherein the second insulation film is formed to include an air gap therein.

9. The method according to claim 1, wherein the first conductive layer and the second conductive layer is formed of polysilicon.

10. The method according to claim 1, wherein the second conductive layers comprises any one of titanium, tungsten, and titanium nitride, or a stacked film of at least two of them.

11. The method according to claim 1, wherein the second conductive layer comprises a salicide structure of titanium, cobalt, or nickel metal.

12. The method according to claim 1, wherein each of the first and second gate insulation films comprise silicon oxide.

13. The method according to claim 1, wherein the intergate insulation film comprises one of silicon oxide, silicon nitride, aluminum oxide, hafnium oxide, and zirconia oxide, or a stacked film of at least two of them.

14. The method according to claim 1, wherein a plurality of memory cells are arranged and connected to a NAND type.

* * * * *